(12) United States Patent
Spath et al.

(10) Patent No.: US 10,895,011 B2
(45) Date of Patent: Jan. 19, 2021

(54) MODULAR THIN FILM DEPOSITION SYSTEM

(71) Applicant: Eastman Kodak Company, Rochester, NY (US)

(72) Inventors: Todd Mathew Spath, Hilton, NY (US); Carolyn Rae Ellinger, Rochester, NY (US); Shelby Forrester Nelson, Pittsford, NY (US); Lee William Tutt, Webster, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 798 days.

(21) Appl. No.: 15/458,235

(22) Filed: Mar. 14, 2017

(65) Prior Publication Data

US 2018/0265976 A1  Sep. 20, 2018

(51) Int. Cl.
*C23C 16/455* (2006.01)
*C23C 16/44* (2006.01)
(Continued)

(52) U.S. Cl.
CPC .... *C23C 16/45544* (2013.01); *C23C 16/4412* (2013.01); *C23C 16/4583* (2013.01);
(Continued)

(58) Field of Classification Search
CPC ........ C23C 16/45544; C23C 16/45551; C23C 16/4583; C23C 14/50; C23C 16/458;
(Continued)

(56) References Cited

U.S. PATENT DOCUMENTS 5,136,975 A   8/1992  Bartholomew et al.
6,183,565 B1* 2/2001  Granneman ...... C23C 16/45521
                                                     118/724
(Continued)

FOREIGN PATENT DOCUMENTS

EP       1 283 279      2/2003
JP       2005-179705    7/2005

OTHER PUBLICATIONS

E. Granneman, "Conduction Heating in RTP Fast, and Pattern-independent," Materials Science Forum, vols. 573-574, pp. 375-386.

(Continued)

*Primary Examiner* — Aiden Lee
(74) *Attorney, Agent, or Firm* — Kevin E. Spaulding; David A. Novais

(57) ABSTRACT

A modular thin film deposition system, includes a machine base, a deposition head for depositing a thin film of material onto a process surface of a substrate, a motion actuator including a fixed portion and a moveable portion, and one or more interchangeable substrate positioner modules adapted to mount on the moveable portion of the motion actuator. The interchangeable substrate positioner modules include kinematic mounting features that engage with corresponding kinematic mounting features on the moveable portion of the motion actuator. The motion actuator moves the interchangeable substrate positioner in a motion direction, thereby moving the substrate in an in-track direction in a plane parallel to the output face of the deposition head during deposition of the thin film of material onto the process surface of the substrate.

21 Claims, 17 Drawing Sheets

(51) Int. Cl.
*C23C 16/46* (2006.01)
*C23C 16/52* (2006.01)
*C23C 16/458* (2006.01)

(52) U.S. Cl.
CPC .. *C23C 16/45527* (2013.01); *C23C 16/45551* (2013.01); *C23C 16/46* (2013.01); *C23C 16/52* (2013.01)

(58) Field of Classification Search
CPC ............ C23C 16/4581; C23C 16/4582; C23C 18/163; C23C 14/568; C23C 14/243; H01J 37/20; H01J 37/32715; H01J 2237/0456; H01J 2237/20; H01J 2237/2007; H01L 21/67; H01L 21/6735; H01L 21/67353; H01L 21/67383; H01L 21/67346; H01L 21/68714; H01L 21/673; H01L 21/68785; H01L 2221/67; H01L 2221/683; H01L 2221/68345
USPC ................ 118/728, 729; 156/345.51, 345.52
See application file for complete search history.

(56) References Cited

U.S. PATENT DOCUMENTS

| | | | |
|---|---|---|---|
| 7,413,982 | B2 | 8/2008 | Levy |
| 7,456,429 | B2 | 11/2008 | Levy |
| 7,572,686 | B2 * | 8/2009 | Levy ................. C23C 16/45551 438/149 |
| 7,789,961 | B2 | 9/2010 | Nelson et al. |
| 7,850,780 | B2 | 12/2010 | Levy et al. |
| 8,182,608 | B2 | 5/2012 | Kerr et al. |
| 8,211,231 | B2 | 7/2012 | Kerr et al. |
| 8,361,544 | B2 | 1/2013 | Fedorovskaya et al. |
| 8,398,770 | B2 | 3/2013 | Levy et al. |
| 8,420,168 | B2 | 4/2013 | Kerr et al. |
| 8,529,990 | B2 | 9/2013 | Fedorovskaya et al. |
| 2006/0127599 | A1 * | 6/2006 | Wojak ..................... C23C 16/01 427/569 |
| 2007/0137568 | A1 * | 6/2007 | Schreiber .............. C23C 14/042 118/718 |
| 2009/0130858 | A1 | 5/2009 | Levy et al. |
| 2009/0304924 | A1 | 12/2009 | Gadgil |
| 2011/0097487 | A1 | 4/2011 | Kerr et al. |
| 2011/0097488 | A1 | 4/2011 | Kerr et al. |
| 2011/0097489 | A1 | 4/2011 | Kerr et al. |
| 2011/0097490 | A1 | 4/2011 | Kerr et al. |
| 2011/0097491 | A1 | 4/2011 | Levy et al. |
| 2011/0097492 | A1 | 4/2011 | Kerr et al. |
| 2011/0097493 | A1 | 4/2011 | Kerr et al. |
| 2011/0097494 | A1 | 4/2011 | Kerr et al. |
| 2013/0323420 | A1 * | 12/2013 | Knaapan ........... C23C 16/45519 427/248.1 |
| 2014/0141154 | A1 * | 5/2014 | Kim ..................... C23C 14/564 427/58 |
| 2014/0377963 | A1 | 12/2014 | Ellinger et al. |
| 2016/0245434 | A1 | 8/2016 | Seeley |

OTHER PUBLICATIONS

D. Levy et al., "Oxide Electronics by Spatial Atomic Layer Deposition," J. Display Technology, vol. 5, pp. 484-494 (2009).
P. Poodt et al., "Spatial atomic layer deposition: A route towards further industrialization of atomic layer deposition," J. Vac. Sci. Technol. A, vol. 30, pp. 010802-1-010802-11 (2012).

* cited by examiner

MODULAR THIN FILM DEPOSITION SYSTEM

CROSS-REFERENCE TO RELATED APPLICATIONS

Reference is made to commonly assigned, co-pending U.S. patent application Ser. No. 15/458,250, entitled "Deposition system with vacuum pre-loaded deposition head," by Spath et al.; to commonly assigned, co-pending U.S. patent application Ser. No. 15/458,262, entitled "Dual gas bearing substrate positioning system," by Spath; to commonly assigned, co-pending U.S. patent application Ser. No. 15/458,270, entitled "Deposition system with moveable-position web guides," by Spath et al.; to commonly assigned, co-pending U.S. patent application Ser. No. 15/458,287, entitled "Deposition system with repeating motion profile," by Spath et al.; to commonly assigned, co-pending U.S. patent application Ser. No. 15/458,297, entitled "Deposition system with modular deposition heads," by Spath et al.; to commonly assigned, co-pending U.S. patent application Ser. No. 15/458,307, entitled "Porous gas-bearing backer," by Spath; to commonly assigned, co-pending U.S. patent application Ser. No. 15/458,322, entitled "Deposition system with interlocking deposition heads," by Tutt et al.; to commonly assigned, co-pending U.S. patent application Ser. No. 15/458,335, entitled "Vertical system with vacuum pre-loaded deposition head," by Spath et al.; and to commonly assigned, co-pending U.S. patent application Ser. No. 15/458,345, entitled "Heated gas-bearing backer," by Spath, each of which is incorporated herein by reference.

FIELD OF THE INVENTION

This invention generally relates to the deposition of thin-film materials and, and more particularly to a modular spatial atomic layer deposition system with shared components.

BACKGROUND OF THE INVENTION

There is a growing interest in depositing thin-film materials from gaseous precursors on a wide range of substrates for a wide variety of applications. Substrates of interest include both rigid substrates, such as flat-panel glass, and flexible substrates, such as plastic webs or metal foils. Flexible supports are of particular interest since they can be more mechanically robust, lighter weight, and allow for more economic manufacturing (e.g., by enabling roll-to-roll processing) than rigid substrates. Thin-film deposition systems, similar to their liquid coating counterparts, are advantaged if the deposition head, or gas delivery device, is smaller in area than the area of the substrate to be coated. For substrates that are continuous, such as webs and foils, the use of a deposition head that is smaller than the area of the substrate is a requirement not just an advantage.

Among the techniques widely used for thin-film deposition is chemical vapor deposition (CVD), which uses chemically reactive molecules that react to deposit a desired film on a substrate. Molecular precursors useful for CVD applications comprise elemental (atomic) constituents of the film to be deposited and typically also include additional elements. CVD precursors are volatile molecules that are delivered, in a gaseous phase, to a chamber in order to react at the substrate, forming the thin film thereon. The chemical reaction deposits a thin film with a desired film thickness.

Atomic layer deposition (ALD) is a thin-film deposition technology that provides excellent thickness control of conformal thin-films. The ALD process segments the thin-film deposition process of conventional CVD into single atomic-layer deposition steps. Advantageously, ALD steps are self-terminating and can deposit one atomic layer when conducted up to or beyond self-termination exposure times. An atomic layer typically ranges from about 0.1 to about 0.5 molecular monolayers, with typical dimensions on the order of no more than a few angstroms. In ALD, deposition of an atomic layer is the outcome of a chemical reaction between a reactive molecular precursor and the substrate. In each separate ALD reaction-deposition step, the net reaction deposits the desired atomic layer and substantially eliminates "extra" atoms originally included in the molecular precursor. In its most pure form, ALD involves the adsorption and reaction of each of the precursors in the absence of the other precursor or precursors of the reaction. In temporal vacuum ALD, thin-film growth is accomplished by alternating the delivery of two or more reactive materials, or precursors, into a vacuum chamber in time. Sequentially, a first precursor is applied to react with the substrate, the excess of the first precursor is removed, and a second precursor is then applied to react with the substrate surface. The excess of the second precursor is then removed and the process is repeated. In all ALD processes, the substrate is exposed sequentially to a series of reactants that react with the substrate and are kept isolated from each other to avoid CVD or gas phase reactions. An ALD cycle is defined by the steps required to form a single layer of the overall thin-film material; for a process using two precursors a cycle is defined as the first precursor exposure, a purge step, the second precursor exposure, and a second precursor purge step.

A version of ALD processes known as spatial atomic layer deposition (SALD) employs a continuous (as opposed to pulsed) gaseous material distribution from a deposition head. As distributed from the deposition head, the gaseous precursors are separated in space by the flow of an inert gas, rather than being separated in time. While vacuum chambers can be used with SALD, they are no longer necessary due to the physical separation of the gas flows rather than a temporal separation of the precursors within a single chamber. In SALD systems, the required sequential exposures are accomplished by relative movement between the substrate and the delivery head such that any given point on the substrate sees the necessary sequence of gaseous materials. This relative movement can be accomplished by moving a substrate relative to a fixed delivery head, moving a delivery head with respect to a fixed substrate, or moving both the delivery head and the substrate in order to achieve the desired gas exposure at the substrate. Exemplary SALD processes, are described in commonly-assigned U.S. Pat. No. 7,413,982, U.S. Pat. No. 7,456,429, U.S. Pat. No. 7,789,961, and U.S. Patent Application Publication 2009/0130858, the disclosures of which are incorporated herein by reference. SALD enables operation at atmospheric or near-atmospheric pressures and is capable of operating in an unsealed or open-air environment, making it compatible with web coating.

SALD offers considerable promise as a technique for thin film deposition on a range of substrates. However, in spite of its inherent technical capabilities and advantages, a number of technical hurdles still remain. As in all ALD processes, the thickness of the SALD deposited thin-film is controlled by the number of ALD cycles to which the substrate is exposed, where a cycle is defined by the exposure of the substrate to the minimum required reactant and purge gas flows to form the desired thin-film composition. Due to the process being limited to an atomic layer of growth per cycle, repeated cycles are required to deposit a thin-film having an appreciable thickness. In order to effectively achieve repeated cycles, SALD requires either motion of the substrate past the deposition head or the development of complex equipment such that the delivery head moves with its gas connections, relative to the substrate. Thin-films of appreciable thickness can be accomplished by either 1) using a deposition head containing a sufficient number of gas distribution cycles and moving a substrate (or head) in a unidirectional motion relative to the head (or substrate) or 2) using a head with a limited number of cycles and using relative reciprocating motion. In instances where the substrate or the deposition head are moved by a reciprocating movement, there remains a technical challenge to manage the sequence of gas exposures since the substrate can be exposed to the gases in a different sequence during a forward stroke and a backward stroke. Furthermore, in order to deposit a thin-film over an entire substrate, the substrate or the head may have to travel a long distance in order to expose substrate to the process gases. There remains a need to provide alternative arrangements to both the very large deposition heads and long distance motion profiles such that large substrates may be easily coated.

One alternative to a single large deposition head is to use multiple deposition heads, or modules, within a larger deposition section. Commonly-assigned U.S. Pat. No. 8,182,608 (Kerr et al.), which is incorporated herein by reference, relates to an apparatus for maintaining the alignment or positional relationship between at least two modules in an SALD system. U.S. Pat. No. 8,182,608 describes aligning multiple delivery heads in a 1-D array, addressing the ability to coating longer substrates or provide thicker thin-film coatings. While simplifying the manufacturing of the deposition head, it does not address the challenge of making coatings of different thicknesses using the same tool, or the footprint required for providing a large deposition section in a manufacturing environment. Additionally, there remains a need for a way to arrange modular heads to be able to coat wider substrates without coating defects or non-uniformity. Additionally, there remains a need for a motion profile that enables the use of small deposition heads in order to build up a sufficient layer thickness from an SALD. Furthermore, there remains a need for a substrate handling means for coating on roll-to-roll webs that enables exposure of the substrate to multiple SALD cycles during deposition, while simultaneously moving the substrate smoothly from the feed roll to the take-up roll.

In order to function properly, an SALD system must maintain the separation of the reactant gases. Although separated in space and by a purge gas as delivered by the deposition head, the system must be further designed to insure that the gases do not mix in the region between the deposition head and the substrate. Commonly-assigned U.S. Patent Application Publication 2009/0130858 (Levy), relates to an SALD deposition system and method using a delivery head where the distance between the substrate and the deposition head is maintained by gas pressure. In this device, the pressure of flowing reactive and purge gases is used as a means to control the separation between the deposition head and the substrate. Due to the relatively large pressures that can be generated in such a system, gases are forced to travel in well-defined paths and thus eliminate undesired gas intermixing.

The system of U.S. Patent Application Publication 2009/0130858 operates as a gas-bearing SALD system. The gas bearing operation maintains a close proximity of the substrate to the deposition head, and either the substrate or head must be free to move in the direction normal the deposition head. The use of a gas bearing SALD head is advantaged due to the resultant pressure profiles that separate the precursor gasses by the purge gas and prevent undesired gas intermixing. There remains a need for SALD systems that utilize a gas-bearing deposition head to coat large substrates, particularly for depositions systems with small manufacturing footprints. There remains a need to coat long substrates with deposition heads that are considerably smaller than the coating length, both for piece-parts and particularly for roll-to-roll webs; this need further necessitates novel motion control profiles and substrate handling. There remains a further need for roll-to-roll SALD systems that utilize a gas-bearing deposition head having a simple construction, as well as roll-to-roll systems that can manage potential substrate distortions and can isolate the motion needed for deposition from the global motion of the web through the system. Additionally, there remains a need, for a modular system that can accommodate different substrate form factors, including roll-to-roll webs of substrate, and provide a system that is relatively low in cost and easy to use.

SUMMARY OF THE INVENTION

The present invention represents a modular thin film deposition system, including:

a machine base;

a deposition head rigidly positioned relative to the machine base for depositing a thin film of material onto a process surface of a substrate, the deposition head having an output face that faces the process surface of the substrate;

a motion actuator including a fixed portion rigidly attached to the machine base, and a moveable portion including kinematic mounting features; and one or more interchangeable substrate positioner modules adapted to mount on the moveable portion of the motion actuator, wherein the interchangeable substrate positioner modules include mating kinematic mounting features that engage with the kinematic mounting features of the moveable portion of the motion actuator, each interchangeable substrate positioner module being adapted to position the substrate in proximity to the output face of the deposition head such that the process surface of the substrate is parallel to the output face of the deposition head and the substrate is free to move in a direction normal to the output face of the deposition head;

wherein the motion actuator moves the interchangeable substrate positioner in a motion direction, thereby moving the substrate in an in-track direction in a plane parallel to the output face of the deposition head during deposition of the thin film of material onto the process surface of the substrate.

The modular SALD system of the present invention has the advantage that a multitude of substrate materials and formats may be accommodated by a reconfigurable/modular arrangement of system components. It is a further advantage that a basic system can be configured with a minimum component count and that additional components can be incrementally added to increase capability. It is a further advantage that expensive components of the system apparatus can be used across multiple work piece formats (e.g., the deposition head, the motion actuator and control system, and the gas flow control system).

It is a further advantage that components of the modular SALD system can be readily reinstalled in repeatable positions without requiring complex alignment, thereby facilitating rapid changeover between different system configurations. This is advantageous to support "piece-part" work.

It is an additional advantage that the deposition head remains in a fixed location with unbroken gas connections for all configurations. No moving seals or flexible gas lines are required. Furthermore, the deposition head can be removed and reattached in a repeatable position for periodic maintenance. It is a further advantage that secondary web transport motion controls for roll-to-roll substrate configurations operate independently of the primary motion actuator.

BRIEF DESCRIPTION OF THE DRAWINGS

It is to be understood that the attached drawings are for purposes of illustrating the concepts of the invention and may not be to scale. Identical reference numerals have been used, where possible, to designate identical features that are common to the figures.

DETAILED DESCRIPTION OF THE INVENTION

Figure 1:
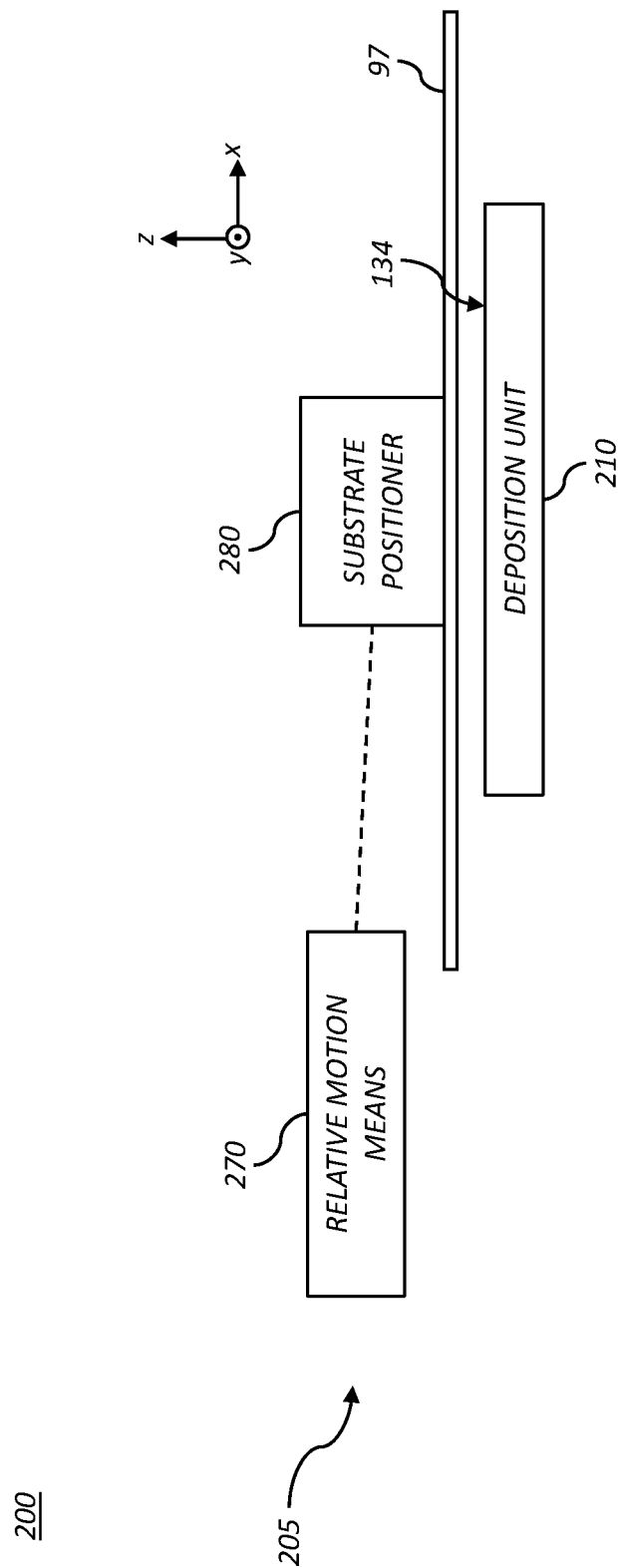
FIG. 1 is schematic block diagram showing the functional elements of an SALD deposition system.

Throughout the specification and claims, the following terms take the meanings explicitly associated herein, unless the context clearly dictates otherwise. The meaning of "a," "an," and "the" includes plural reference, the meaning of "in" includes "in" and "on." Additionally, directional terms such as "on," "over," "top," "bottom," "left," and "right" are used with reference to the orientation of the figure(s) being described. Because components of embodiments of the present invention can be positioned in a number of different orientations, the directional terminology is used for purposes of illustration only and is in no way limiting.

The invention is inclusive of combinations of the embodiments described herein. References to "a particular embodiment" and the like refer to features that are present in at least one embodiment of the invention. Separate references to "an embodiment" or "particular embodiments" or the like do not necessarily refer to the same embodiment or embodiments; however, such embodiments are generally not mutually exclusive, unless so indicated or as are readily apparent to one of skill in the art. The use of singular or plural in referring to the "method" or "methods" and the like is not limiting. It should be noted that, unless otherwise explicitly noted or required by context, the word "or" is used in this disclosure in a non-exclusive sense. Even though specific embodiments of the invention have been described herein, it should be noted that the present invention is not limited to these embodiments. In particular, any features described with respect to one embodiment may also be used in other embodiments, where compatible. The features of the different embodiments can be exchanged, where compatible.

It is to be understood that elements not specifically shown, labeled, or described can take various forms well known to those skilled in the art. In the following description and drawings, identical reference numerals have been used, where possible, to designate identical elements. It is to be understood that elements and components can be referred to in singular or plural form, as appropriate, without limiting the scope of the invention.

The example embodiments of the present invention are illustrated schematically and are not to scale for the sake of clarity. One of ordinary skill in the art will be able to readily determine the specific size and interconnections of the elements of the example embodiments of the present invention. Therefore, the provided figures are not drawn to scale but are intended to show overall function and the structural arrangement of some embodiments of the present invention.

The embodiments of the present invention relate components for systems useful for thin-film deposition. In preferred embodiments, the thin-film deposition is done using a spatial atomic layer deposition (SALD) process. For the description that follows, the term "gas" or "gaseous material" is used in a broad sense to encompass any of a range of vaporized or gaseous elements, compounds, or materials. Other terms used herein, such as: reactant, precursor, vacuum, and inert gas, for example, all have their conventional meanings as would be well understood by those skilled in the materials deposition art. Reactant gas flows can include multiple reactive species together with inert gaseous species. In some embodiments, the reactive gases can include a reactive plasma, such as supplied by a remote plasma source. One type of remote plasma source that can be used includes a surface dielectric barrier discharge source. As such, plasma-enhanced spatial ALD (PE-SALD) arrangements are considered to be useful in some embodiments. While the exemplary embodiments are described in the context of SALD systems, those skilled in the art will recognize that aspects of the present invention can also be used for any application which involves exposing a substrate to one or more gaseous substances, such as chemical vapor deposition processes.

Unless otherwise explicitly noted or required by context (for example, by the specified relationship between the orientation of certain components and gravity), the term "over" generally refers to the relative position of an element to another and is insensitive to orientation, such that if one element is over another it is still functionally over if the entire stack is flipped upside down. As such, the terms "over", "under", and "on" are functionally equivalent and do not require the elements to be in contact, and additionally do not prohibit the existence of intervening layers within a structure. The term "adjacent" is used herein in a broad sense to mean an element next to or adjoining another element. The figures provided are not drawn to scale but are intended to show overall function and the structural arrangement of some embodiments of the present invention.

Embodiments of the present invention are illustrated and described with a particular orientation for convenience; and unless indicated specifically, such as by discussion of gravity or weight vectors, no general orientation with respect to gravity should be assumed. For convenience, the following coordinate system is used: the z-axis is perpendicular to the output face of the deposition head, the x-axis is parallel to the primary motion direction (in the plane of the output face), and the y-axis is perpendicular to the primary motion axis (in the plane of the output face). Roll, pitch, and yaw are as used herein have their commonly understood definitions. To facilitate interpretation of relative motion and degrees of freedom, the following clarifications are provided. Roll is the rotation about an axis parallel to the primary motion axis (x-axis). Pitch is the rotation about the y-axis in the plane of the output face of the delivery device and perpendicular to the primary motion axis. Yaw is the rotation about the z-axis which is normal to the output face of the delivery device.

An ALD process accomplishes thin-film growth on a substrate by the alternating exposure of two or more reactive materials, commonly referred to as precursors, either in time or space. A first precursor is applied to react with the substrate. The excess of the first precursor is removed and a second precursor is then applied to react with the substrate surface. The excess of the second precursor is then removed and the process is repeated. In all ALD processes, the substrate is exposed sequentially to a series of reactants that react with the substrate. The thickness of the ALD (and SALD) deposited thin-films is controlled by the number of ALD cycles to which the substrate is exposed, where a cycle is defined by the exposure to the minimum required reactant and purge gas flows to form the desired thin-film composition. For example, in a simple design, a single cycle can provide one application of a first reactant gaseous material $G1$ and one application of second reactant gaseous material $G2$. In order to effectively achieve repeated cycles, SALD requires either motion of the substrate past the deposition head or the development of complex equipment such that the delivery head with its gas connections, can be moved relative to the substrate. Thin-films of appreciable thickness can be accomplished by either 1) using a deposition head containing a sufficient number of gas distribution cycles and moving the substrate (or the deposition head) in a unidirectional motion relative to the deposition head (or substrate) or 2) using a deposition head with a limited number of cycles and using relative reciprocating motion.

In order to effectively use an SALD deposition head for thin-film deposition, it is commonly employed within a larger SALD system, or apparatus. Typically, such systems are specifically designed to deposit thin films on a particular type of substrate (for example, either rigid or flexible). Furthermore, SALD systems typically utilize a singular motion profile type that is chosen as a result of the design of the deposition head and the type of substrate being coated. In many cases, SALD systems are further designed for a specific application, and as such are configured to coat a single material at a given thickness on a substrate having a particular form factor.

As known by one skilled in the art, each SALD system requires at least three functional elements in order to effectively deposit a thin-film, namely a deposition unit, a substrate positioner and a means of relative motion. To date, the specific design of each functional element has generally differed from system to system. As will be described, preferred embodiments of the SALD systems of the present invention are modular in nature, and as such includes a range of components of differing design that can be exchanged to perform the function of a particular functional element within the novel SALD platform. The design and advantages of specific components useful in a range of SALD systems, and design and advantages of inventive elements and configurations of the novel modular SALD platform of the present invention will be better understood with respect to the Figures.

As shown in schematic block diagram of FIG. 1, SALD system 200 of the present invention is preferably one in which a substrate 97 is moved relative to a fixed deposition unit 210. As such, substrate 97 is positioned over the output face 134 of a deposition unit 210 by substrate positioner module 280, and relative motion between the substrate 97 and the deposition unit 210 is accomplished by motion of the substrate positioner module 280 using relative motion means 270, which can also be referred to as a motion controller or a motion control means. The deposition unit 210, substrate positioner module 280 and relative motion means 270 are functional elements of deposition subsystem 205 of SALD system 200. In various embodiments of the present invention, the deposition unit 210 can be a single deposition head 30 or can be a deposition unit that include an array of deposition heads 30. The relative motion means 270 interacts with the substrate positioner module 280 to move the substrate 97 relative to the deposition unit 210.

The substrate positioner module 280 is preferably an interchangeable substrate positioning module, with the modular system having multiple substrate positioning modules that can be easily exchanged into the SALD system 200, where the different substrate positioning modules are configured to handle different types of substrates 97 and different substrate form factors.

Many types of substrates can be coated with the SALD system 200. The substrates 97 used in the present invention can be any material that acts as a mechanical support for the subsequently coated layers. The substrate 97 can include a rigid material such as glass, silicon, or metals. The substrate can also include a flexible material such as a polymer film or paper. Useful substrate materials include organic or inorganic materials. For example, the substrate can include inorganic glasses, ceramic foils, and polymeric materials. The thickness of substrate 97 can vary, typically from about 25 µm to about 1 cm. Using a flexible substrate 97 allows for roll processing, which can be continuous, providing economy of scale and economy of manufacturing relative to flat or rigid supports.

In some example embodiments, the substrate 97 can include a temporary support or support material layer, for example, when additional structural support is desired for a temporary purpose, e.g., manufacturing, transport, testing, or storage. In these example embodiments, the substrate 97 can be detachably adhered or mechanically affixed to the temporary support. For example, a flexible polymeric support can be temporarily adhered to a rigid glass support to provide added structural rigidity during the deposition process. The glass support can be removed from the flexible polymeric support after completion of the manufacturing process. The substrate 97 can be bare indicating that it contains no substantial materials on its surface other the material from which it is composed. The substrate 97 can include various layers and patterned materials on the surface.

The relative motion means 270 is adapted to connect to the interchangeable substrate positioner modules, and as such, the relative motion means 270 and the interchangeable substrate positioner modules preferably contain appropriate mating features. The substrate positioner module 280 is designed to position the substrate 97 in the x- and y-directions relative to the output face 134 of the deposition unit 210. The SALD system 200 may also include a secondary substrate positioner (not shown) which is designed to control the position of the substrate 97 in the z-direction.

In various configurations, the substrate 97 can be attached to a backer device during deposition. The backer device can be used as heat source for the substrate, or to stiffen otherwise flexible substrates. A backer that is temporarily attached to the substrate, by vacuum for example, is intended to move with the substrate during relative motion between the substrate and a fixed deposition head. The backer attachment can provide greatly increased rigidity and flatness to flexible substrates. A backer device useful in the present invention can be larger than the substrate, as might be used to stabilize piece-parts of flexible substrate or approximately the same size as the substrate, or significantly smaller than the substrate when the substrate is rigid and self-supporting. As used herein, the "substrate unit" refers to either the substrate 97 alone or a substrate 97 with an attached backer device; the substrate unit has relative motion relative to the deposition unit 210.

Figure 2A:
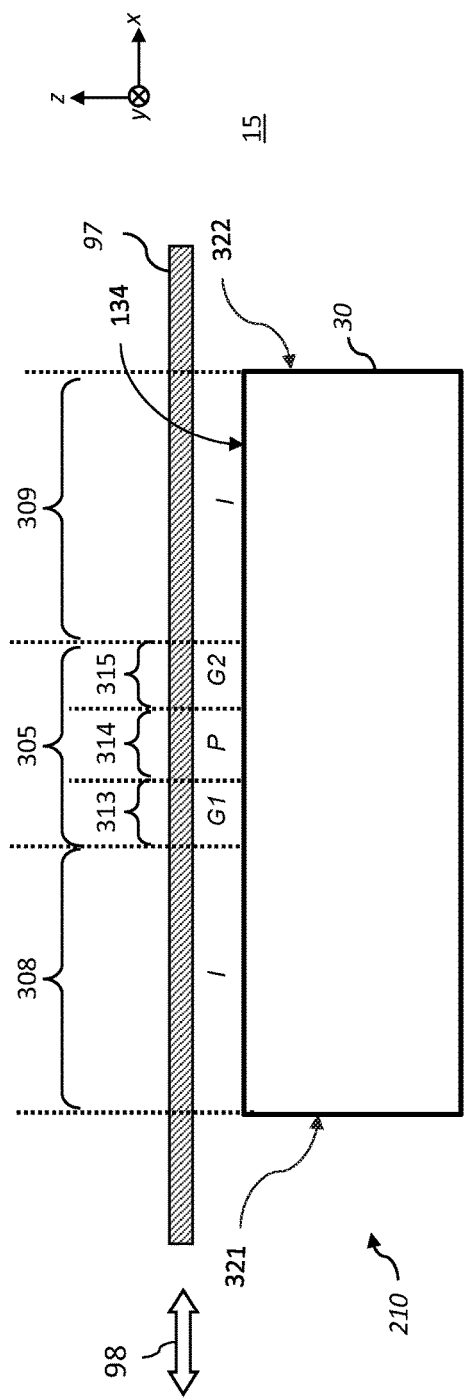
FIGS. 2A-2C are cross-sectional side views of SALD deposition heads useful in the present invention having a single ALD cycle.
Figure 2B:
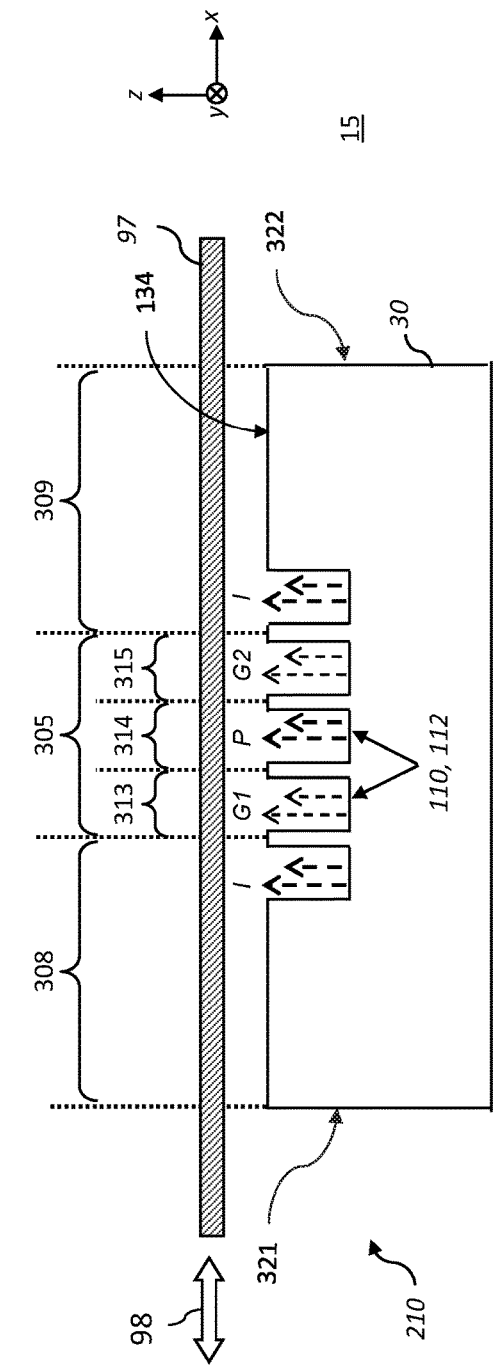
Figure 2C:
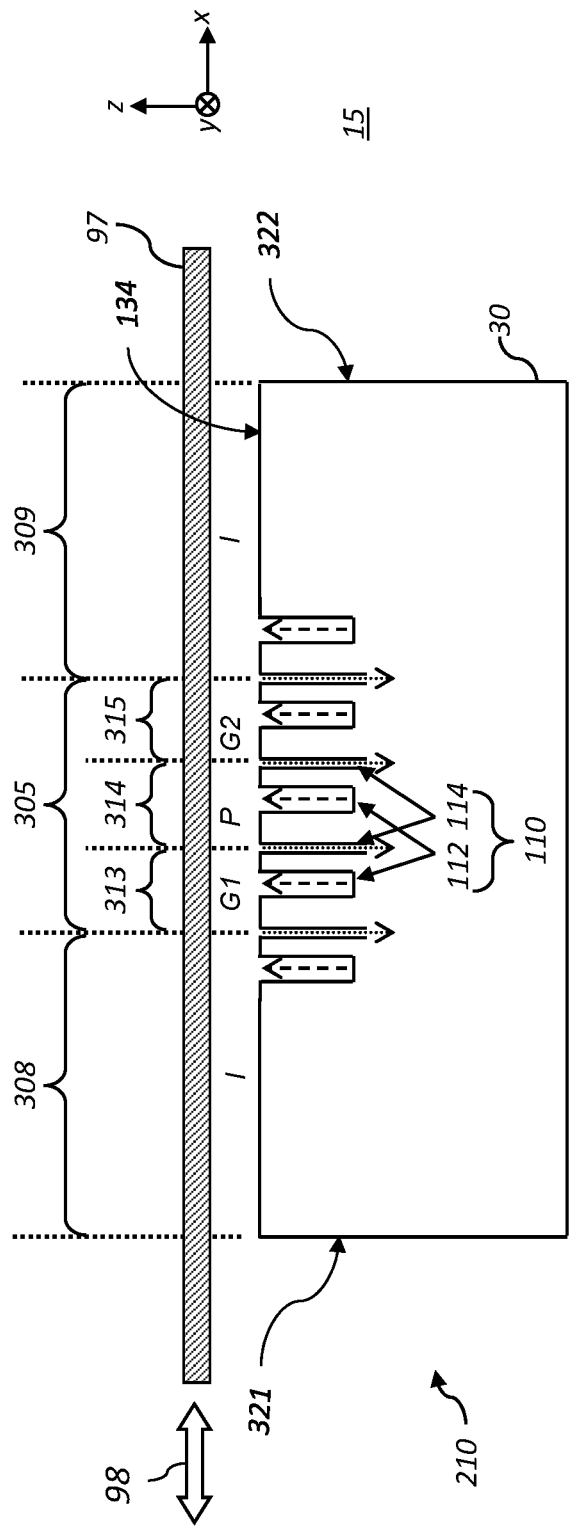

The deposition unit 210 can use any type of SALD deposition head that is known in the art. FIGS. 2A-2C illustrate deposition heads 30 that are configured to simultaneously supply a plurality of gaseous materials from the output face in different gas zones within a deposition zone 305. In all three figures, the deposition zone 305 contains the necessary gas zones for a single two-step ALD deposition cycle. Moving from left to right within the deposition zone 305, there is a first reactive gas zone 313 (G1) followed by an inert gas purge zone 314 (P), and a second reactive gas zone 315 (G2). As the relative motion means 270 (FIG. 1) moves the substrate 97 relative to the deposition head 30 (the x-direction being the primary motion direction as indicated by motion arrow 98), a particular location on the substrate 97 sees the above sequence of gases which results in ALD deposition. Deposition heads 30 of the present can include a deposition zone 305 with gas zones for any number of ALD deposition cycles, the single ALD cycle illustrated is for clarity of understanding.

The SALD systems of the present invention can use any deposition head geometry so long it has the required gas delivery to form gas zones between the deposition head 30 and the substrate 97 in the required order to accomplish an ALD cycle, as illustrated by the simplified deposition head 30 of FIG. 2A. In preferred embodiments, the reactive gases (G1 and G2, for example) have little or no intermixing to avoid a CVD component during film deposition or gas phase reactions. The purge zone 314 (P) serves to separate the reactive gases G1, G2 and allows for the removal of any reaction byproducts from the substrate surface as it moves through the purge zone 314.

A single deposition cycle (moving from left to right) is defined by an inert gas flow I, followed by a first reactive gas flow G1, followed by an inert purge gas flow P, and lastly by a second reactive gas flow G2. The deposition zone 305 has a deposition zone length that spans the distance from the start of the first reactive gas zone to the end of the last reactive gas zone (e.g., from the first reactive gas zone 313 to the second reactive gas zone 315 in FIG. 2A).

The deposition heads 30 illustrated in FIGS. 2A-2C, have extended inert zones 308, 309 on either side of the deposition zone 305. The first inert zone 308 has a first inert zone length that spans the distance from the left edge 321 of the deposition head 30 to the boundary of the first reactive gas zone 313. The second inert zone 309 has a second inert zone length that spans the distance from the boundary of the second reactive gas zone 315 to the right edge 322 of the deposition head 30. The extended inert zones 308, 309 isolate the deposition zone 305 from the external environment 15 and enable the deposition head 30 to coat substrates 97 that are substantially longer than the length of the deposition head 30 without exposing the growth region to the external environment 15. Deposition heads of the prior art are typically operated within a larger system where the external environment is controlled to be inert, under vacuum, or both. In preferred embodiments of the present invention, the deposition head 30 can be used at atmospheric pressure without any additional environmental controls for the external environment 15. One of the advantages of the present invention is that the deposition head 30 and SALD system 200 containing it can be used to coat on substrates 97 whose length is much larger than the length of the deposition zone 305. A further advantage of some embodiments of the present invention is the ability to control the environment of the region of the substrate being actively coated during deposition. Additionally, the relatively small deposition head size allows for lower cost manufacturing of the deposition head.

It is known that ALD is self-limiting, meaning that when all available sites on a substrate surface have reacted with a precursor there is no further reaction during that half-step. When both half-reactions in a deposition cycle have sufficient time and available precursor to reach this state, it is said that the ALD cycle has reached "saturation". ALD depositions done in these conditions are by definition, saturated ALD, and continued exposure to the precursors does not change significantly the deposition amount. In SALD, the substrate velocity and length of reaction zones determine the exposure time to a give precursor. For a given velocity, there is a minimum zone length required to reach saturation (i.e., a "saturation length") and zone lengths longer than the saturation length do not add film thickness during material deposition. SALD systems of the present invention can be used in both saturated and sub-saturated conditions. One advantage of the present invention is that sub-saturated growth can still be deterministic, since each point on the substrate 97 will see the same concentration of precursors for a time which is set by the substrate velocity and motion profile.

The motion arrow 98 indicates one known motion of the substrate 97 useful in SALD which is to move the substrate 97 in a smooth oscillating, or reciprocating, motion through the entire deposition zone 305 such that the substrate "sees" the required number of cycles to produce the desired coating thickness (as discussed above). In preferred embodiments of the present invention the substrate motion is controlled such that the region being actively coated is prevented from experiencing the external environment during coating. This has the advantage of avoiding contamination of the thin-films during growth by preventing exposure to any reactive species or dust particulates or other contaminates that may be present in the external environment outside of the controlled environment defined by the region between the deposition head 30 and the substrate 97.

The deposition head 30 of FIG. 2B illustrates an embodiment where one or more of the gas zones use a transverse arrangement, such as that disclosed in the aforementioned commonly-assigned U.S. Pat. No. 7,456,429 (Levy et al.), entitled "Apparatus for atomic layer deposition." In a transverse flow arrangement, the flow of gases during deposition is orthogonal, or transverse, to the direction of substrate motion and is exhausted either out the edges of the deposition head 30, or into exhaust slots along the perimeter of the deposition head 30. As illustrated, the deposition head 30 has gas slots 110 (i.e., output slots 112) that are configured to supply the gases into their corresponding gas zones. In other embodiments, the deposition head 30 provides gas to the elongated parallel gas zones through an array of orifices, rather than through the illustrated output slots 112 (elongated channels).

The deposition head 30 of FIG. 2C illustrates a preferred gas bearing deposition head 30 of the present invention. The principles and design of gas bearing deposition heads 30 has been described in detail in the aforementioned U.S. Patent Application Publication 2009/0130858, as well as in commonly-assigned U.S. Pat. No. 7,572,686 (Levy et al.) and entitled "System for thin film deposition utilizing compensating forces." As shown in FIG. 2C, an exemplary deposition unit 210 includes a deposition head 30 that operates on a vacuum-preloaded gas bearing principle having an output face 134 (facing upward) having gas slots 110 which provide gases into the gas zones and exhaust gases from the gas zones. Gases are provided into the gas zones by spatially separated elongated output slots 112 (extending in the y-direction). Each gas zone includes a corresponding output slot 112. Adjacent exhaust slots 114 remove (or exhaust) gas from the gas zones. The exhaust slots 114 are positioned to define the boundaries of the various gas zones. As illustrated, the gas zones are equivalent to those of FIGS. 2A and 2B.

In these preferred embodiments wherein the deposition head 30 operates using a gas bearing principle the substrate 97 is positioned above the output face 134 of the deposition head 30 and is maintained in close proximity to the output face 134 by an equilibrium between the pull of gravity, the flow of the gases supplied to the output face 134 through the output slots 112, and a slight amount of vacuum at the exhaust slots 114. While the gas openings in this example are gas slots 110 (also referred to as gas channels) that extend in the y-direction, one skilled in the art will recognize that the gas openings could also have other geometries, such as a row of nozzles or circular orifices, so long as the proper gases are delivered into and exhausted from the gas zones between the deposition head and the substrate.

As shown in FIG. 2C, the gases are introduced and exhausted in alternating output slots 112 and exhaust slots 114 in the output face 134 of the deposition head 30. The flow of gases between the output slots 112 during deposition is primarily in the direction of substrate travel (forward and backward) toward the adjacent exhaust slots 114. As discussed earlier, the region that spans the reactive gas zones can be referred to as the deposition zone 305, which is preferably surrounded by two inert zones 308, 309. The individual gas zones within the deposition zone 305, where the substrate 97 is exposed to each gas, generally extend outward from the corresponding output slot 112 to the two adjacent exhaust slots 114 as illustrated for the first reactive gas zone 313, the purge zone 314, and the second reactive gas zone 315. In the illustrated configuration, the extended inert zones 308, 309 extend from the inert gas output slots 112 to the edges of the deposition head 30. In alternative embodiments, the extended inert zones 308, 309 can include additional output slots 112 or other gas supply features. Additionally, the extended inert zones 308, 309 can include exhaust slots 114, or other exhaust features, to provide additional protection/separation from the external environment 15.

Using any of the embodiments of deposition head 30 of FIGS. 2A-2C, an SALD deposition process can be accomplished by oscillating the position of the substrate 97 across the deposition head 30 (in the in-track direction indicated by the motion arrow 98) for the number of cycles necessary to obtain a uniform deposited film of the desired thickness for the given application.

Figure 3A:
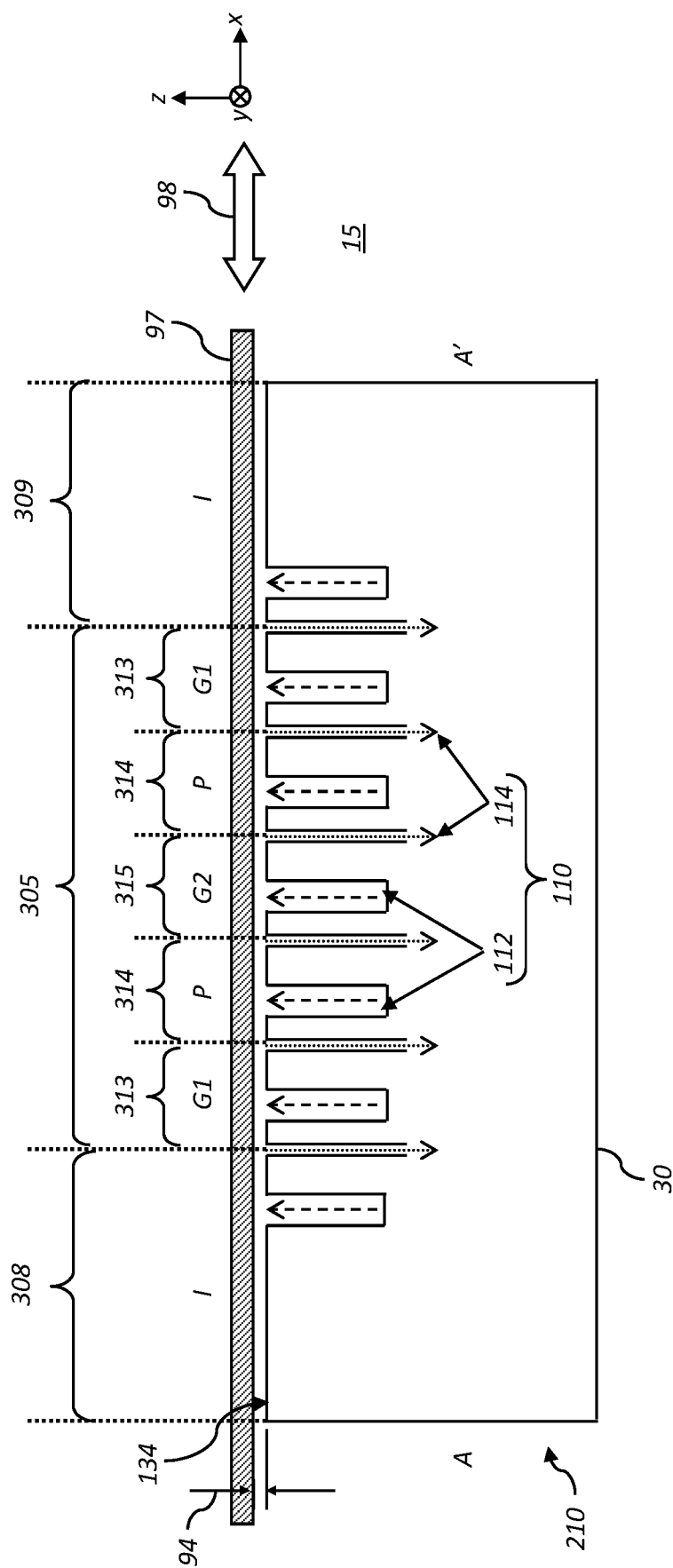
FIG. 3A is a cross-sectional side view of an alternative embodiment of an SALD deposition head having 1.5 ALD cycles.
Figure 3B:
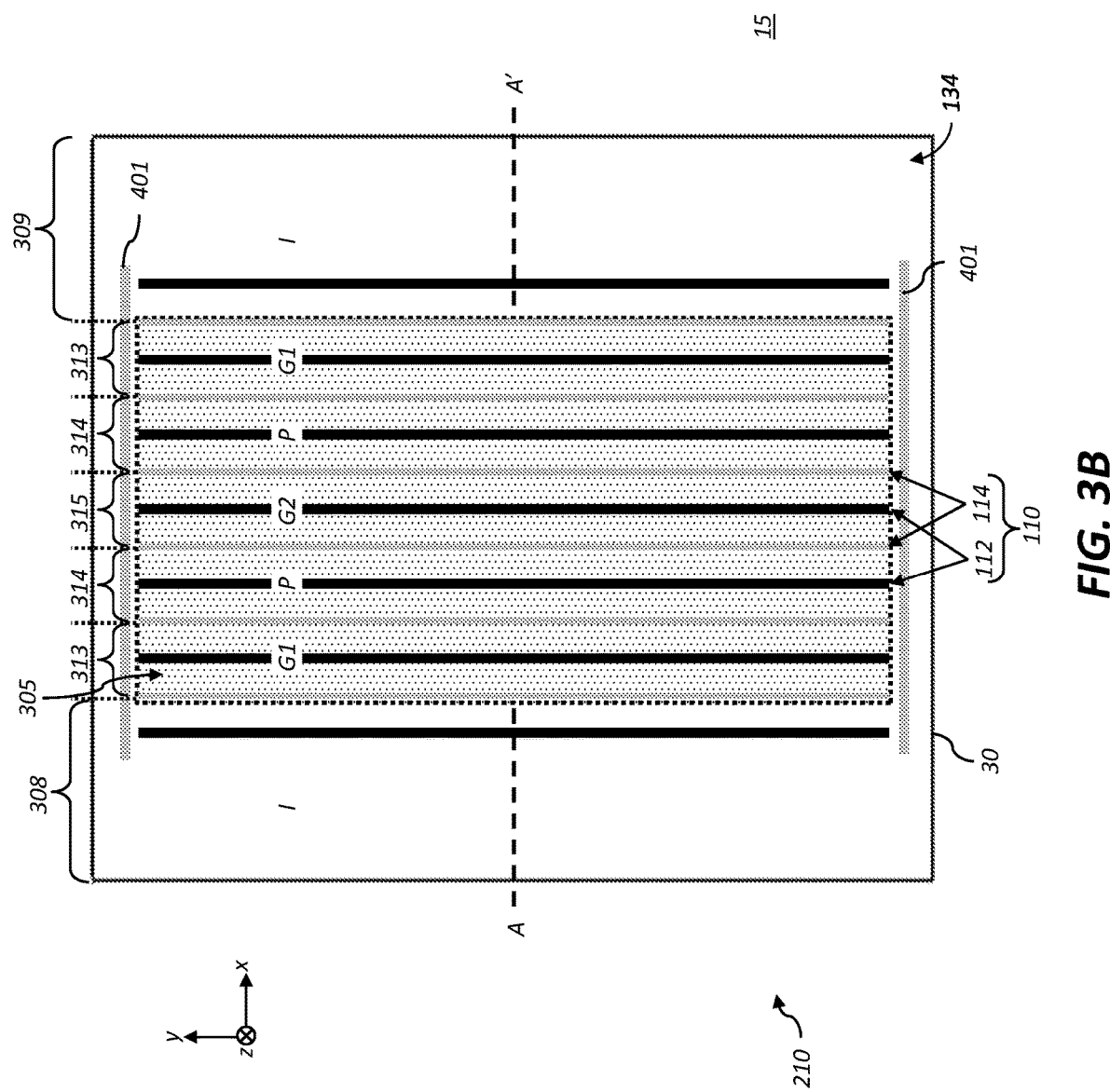
FIG. 3B is a plan view of the SALD head of FIG. 3A.

FIG. 3A is a cross-sectional view of a deposition head 30 illustrating a preferred embodiment of the present invention where the deposition zone 305 is arranged to be symmetric, so that as the substrate 97 is moved relative to the deposition head 30 a position can "see" a full cycle exposure in either a forward or reverse direction. FIG. 3B illustrates a plan view corresponding to the cross-sectional view of FIG. 3A, where the cross-sectional view is taken along the line A-A' of the plan view. In common parlance, the deposition head 30 illustrated in FIG. 3A-3B can be referred to a "one-and-a-half cycle head" or a "1.5 cycle head." Moving from left-to-right through the deposition zone 305, the substrate 97 is exposed to (in order) a first reactive gas zone 313 where the substrate is exposed to a first reactive gas G1, an inert purge zone 314 where the substrate is exposed to an inert purge gas P, a second reactive gas zone 315 where the substrate is exposed to a second reactive G2, another inert purge zone 314 where the substrate is exposed to the purge gas P, and another first reactive gas zone 313 where the substrate is exposed to the first reactive gas G1. Moving in the reverse direction from right-to-left through the deposition zone 305, the substrate 97 is exposed to the same sequence of gases as in the forward (left-to-right) direction, namely the first reactive gas G1, the inert purge gas P, the second reactive gas G2, the inert purge gas P, and the first reactive gas G1. The advantage of this symmetry is that feeding the substrate 97 from left-to-right or right-to-left results in equivalent exposure, and entrance and exit sides of the deposition head 30 depend of the direction of relative motion of the substrate 97 not the design of the deposition head 30.

As with the previous embodiments, the gas zones (or regions) are between the substrate 97 and the deposition head 30. The labels in FIG. 3A are placed above the substrate for clarity and to further emphasize the small working distance 94 between the process-side of substrate 97 and the output face 134 of the deposition head 30 enabled by the use of a vacuum-preloaded gas bearing deposition head 30. As illustrated in the plan-view of FIG. 3B, in addition to the output slots 112 (shown as black lines) and the exhaust slots 114 (shown as gray lines) in the deposition zone 305 (shown as a shaded area), there are additional output slots 401 orthogonal to the gas slots 110 in the deposition zone 305. The additional gas output slots 401 provide inert gas to the cross-track edge region of the deposition head 30, providing further isolation of the deposition zone 305 from the external environment 15.

The exemplary gas bearing deposition head 30 of FIG. 3A has gas slots 110 corresponding to 1.5 ALD cycles to provide the proper sequence of gas exposure in the forward and reverse directions. As the substrate 97 is oscillated back and forth over the deposition head 30, it will provide only a single ALD cycle (one G1 and one G2 exposure) per single direction pass over the deposition head 30, therefore a round trip oscillation provides two ALD cycles. Furthermore, when the second precursor G2 is reactive with the external environment, while the first precursor G1 is not, this arrangement provides additional protection against unwanted reactions involving G2. An example of a precursor pair that would benefit from this arrangement is water and trimethylaluminum (TMA), where water is the non-reactive precursor G1 and TMA is the highly reactive precursor G2.

The deposition head 30 is preferably constructed of a material which does not react with the precursor gases and can withstand the required temperatures without significant deformation. One preferable material is stainless steel. It is recognized that other materials can also be used, but differential thermal expansions must be kept low to prevent distortions. As described, the deposition head 30 delivers multiple reactive and inert process gasses through output face 134. Connection of the various gas sources to the deposition head 30 can be accomplished using individual pipe or tubing connections distributed about the periphery of the deposition head 30. In an exemplary configuration, commercially available fittings, such as Swagelok VCR series components, are used for gas source connections. In preferred embodiments, the gases are supplied to the deposition head 30 via a manifold.

A relatively clean external environment is useful to minimize the likelihood of contamination, but is not necessary. Full "clean room" conditions or an inert gas-filled enclosure can be used in systems of the present invention, however preferred embodiments do not be require control of the external environment and are advantaged for that reason. The apparatus of the present invention is advantaged in its capability to perform deposition onto a substrate 97 over a broad range of temperatures, including room temperature, or near-room temperature, in some embodiments. The apparatus of the present invention can operate in a vacuum environment, but is particularly well suited for operation at or near atmospheric pressure. In preferred embodiments, the SALD process can be performed at or near atmospheric pressure and over a broad range of ambient and substrate temperatures, preferably at a temperature of under 300° C.

Referring to FIG. 1, the SALD system 200 of the present invention is preferably one in which the substrate 97 is moved relative to a fixed deposition unit 210. In preferred embodiments, the SALD system 200 is a modular system with interchangeable substrate positioner modules 280 that are configured to work in conjunction with a common system-level relative motion means 270. In some embodiments, the deposition unit 210 is a single SALD deposition head 30. In preferred embodiments, the deposition unit 210 includes a gas manifold 25 and one or more SALD deposition heads 30. In preferred embodiments the SALD deposition head 30 is configured to operate as a vacuum pre-loaded gas-bearing deposition head such as that described relative to FIGS. 3A-3B. In preferred embodiments, the SALD deposition head 30 includes inert zones 308, 309 with a substantial length. The relative motion means 270 is adapted to connect to the interchangeable substrate positioner modules 280, and as such the relative motion means 270 and the interchangeable substrate positioner modules 280 contain mating mounting features. The system-level relative motion means 270 of the modular SALD system 200 is preferably a primary motion actuator that can be controlled to move the substrate 97 in any arbitrary motion profile via the motion of the substrate positioner modules 280. Preferred motion profiles include an oscillatory motion to coat an area of the substrate 97 larger than the deposition region of the SALD deposition head 30 without exposure to the external environment 15. A particularly preferred motion profile is an "ooching" motion profile, wherein the substrate 97 moves in an oscillatory fashion superposed with continuous forward motion enabling the coating of long, and continuous, substrates as described in commonly-assigned, co-filed U.S. patent application Ser. No. 15/458,287 to Spath et al., entitled "Deposition system with repeating motion profile," which is incorporated herein by reference.

As previously described, the interchangeable substrate positioner modules 280 are capable of handling substrates 97 of different form factors and can be easily exchanged into the modular SALD system 200. The interchangeable substrate positioner modules 280 are designed to position the substrate 97 in x and y relative to the output face 134 of the deposition head(s) 30 deposition unit 210. The SALD system 200 may also include a secondary substrate positioner mechanism which is designed to control the position of the substrate 97 in z. Preferred interchangeable substrate positioner modules 280 include units configured to position substrates 97 of different form factors including small rigid or flexible substrates, large rigid substrates, lengths of flexible material, as well as continuous webs of substrate. As used herein, the interchangeable substrate positioner modules 280 can alternatively be referred to as payload devices.

The previous component level discussion addressed the details of particular embodiments of components of an SALD system 200. The following figures illustrate different configurations of the modular SALD system 200 of the present invention utilizing various exemplary components. The modular SALD system 200 of the present invention addresses the need for a practical deposition system that is suited for handling a wide range of substrates with a robust head-substrate interaction. As described above, the modular SALD system 200 has both shared (common) and interchangeable components allowing semi-custom configurations and easy maintenance.

The modular SALD system 200 that is described herein consist broadly of a mounting apparatus for the deposition head 30 and a set of substrate positioner modules 280 that can accommodate different substrate form factors, including roll-to-roll, and provide a relatively low-cost and easy-to-use system that can provide the required flatness, spacing and motion requirements. In preferred embodiments of the modular SALD system 200, the various components are compatible so that the mounting system can be configured with any necessary components for a given functionality. The following figures illustrate various configurations of an exemplary modular SALD system 200, where components are added or rearranged to change the capability of the system, particularly the capability to handle different substrate form-factors. The exemplary modular SALD system 200 has a single set of common base components, which represent the primary expense in the system, that can be used across multiple system configurations to perform deposition on various substrate formats. In addition, the modular SALD system 200 of the present invention is advantaged in that the change from one configuration to another is easy and allows for rapid changeover.

Figure 4:
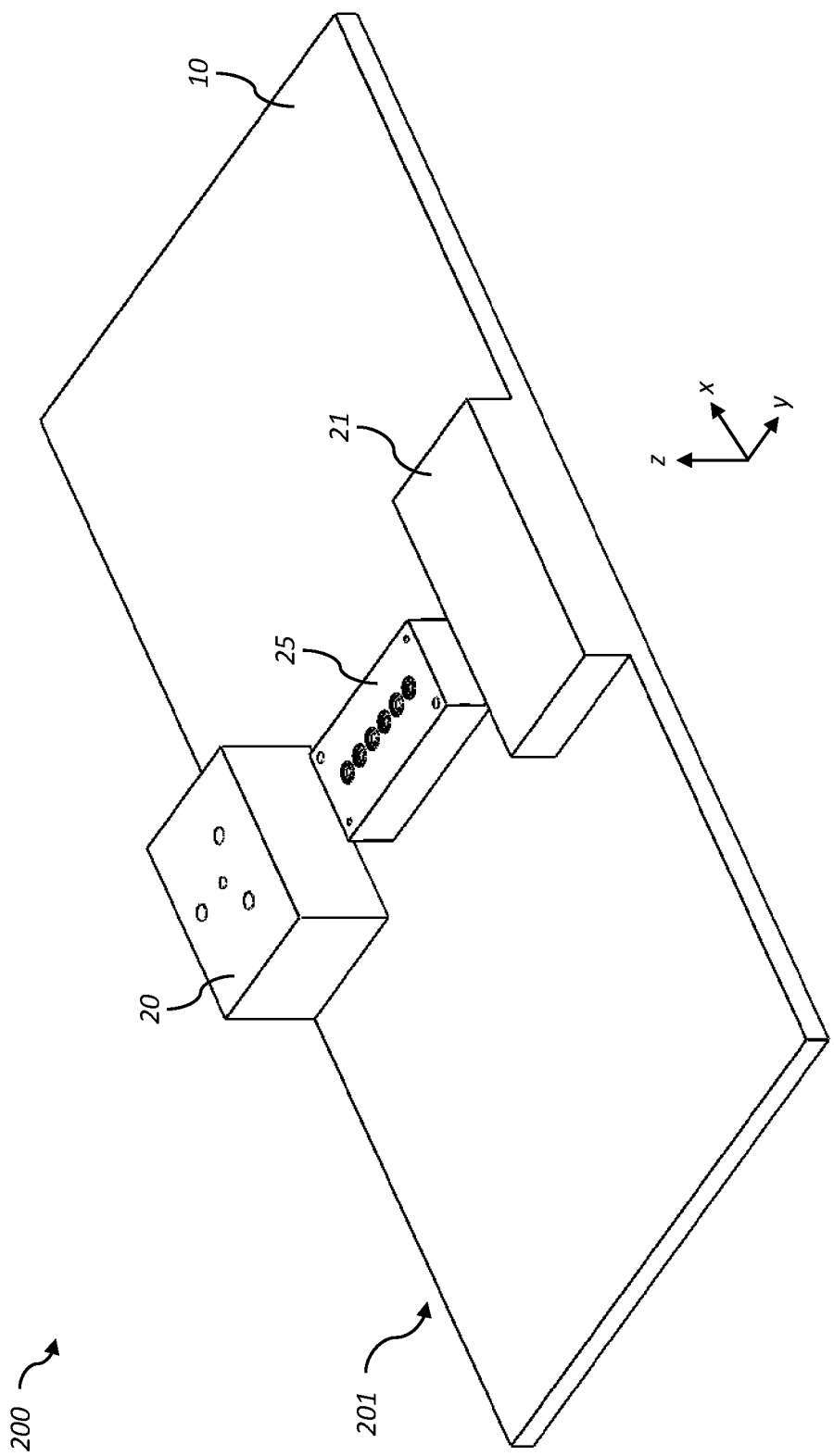
FIG. 4 shows a machine base and gas manifold for a modular SALD system in accordance with an exemplary embodiment.

FIG. 4 illustrates a common mounting subsystem 201 for use with the modular SALD system 200 of the present invention. The mounting subsystem 201 includes a machine base 10 onto which a gas manifold 25 is mounted. Also on machine base 10 are two optional pedestals 20, 21 that can be used to set the height and position of the other components of the system. As illustrated in the following figures, pedestal 21 is used for mounting the relative motion means 270 (i.e., a primary motion actuator in the illustrated embodiment), and pedestal 20 is used for mounting fixed components.

Figure 5:
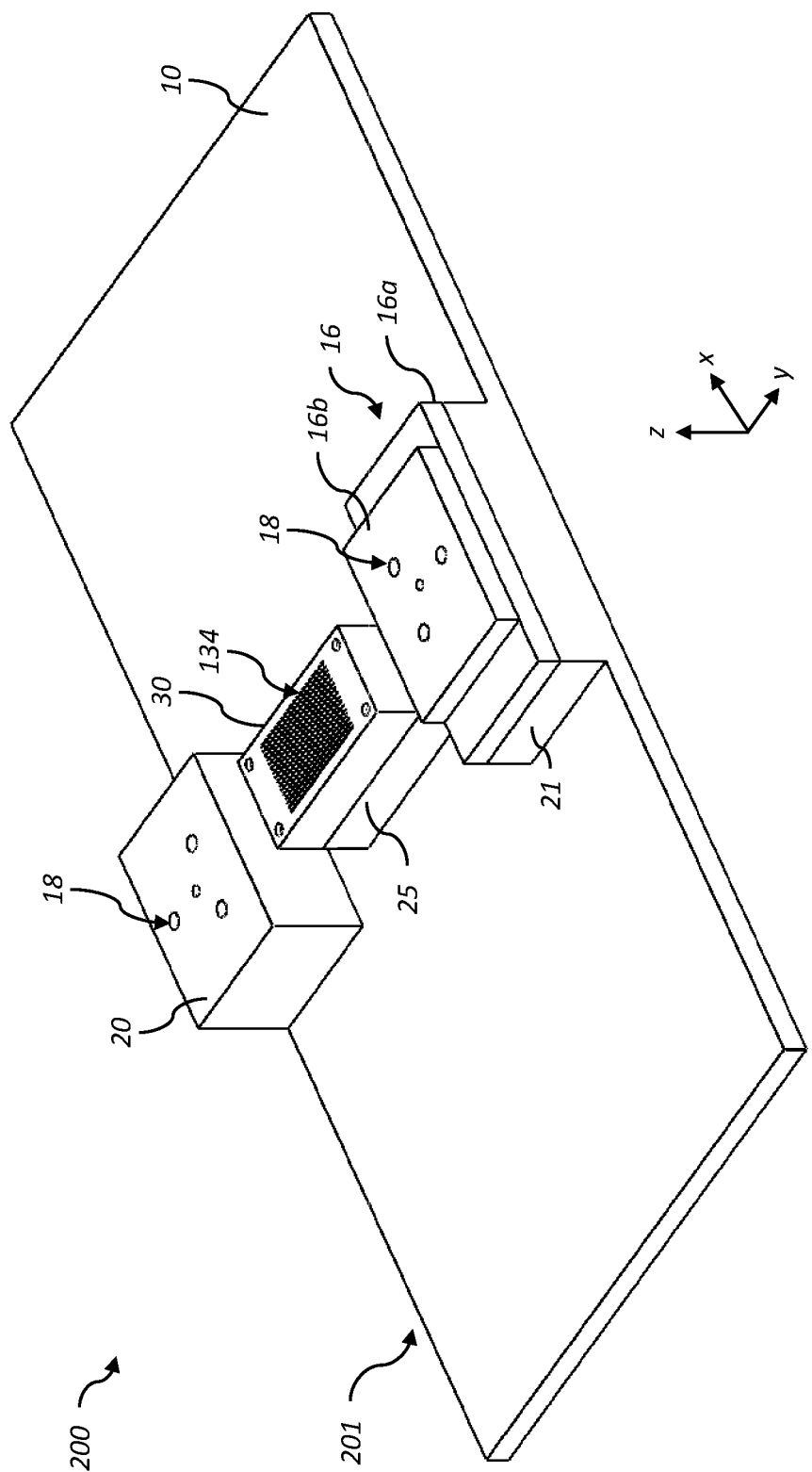
FIG. 5 shows a deposition head having an output face mounted to the machine base and gas manifold of FIG. 4.

FIG. 5 shows the addition of the primary motion actuator 16 to the common mounting subsystem, as well as the addition of the SALD deposition head 30 having an output face 134 which is mounted to the gas manifold 25. In an exemplary embodiment, the gas manifold 25 and the deposition head 30 include corresponding gas ports and interface using appropriate alignment and sealing features such as those described in commonly-assigned, co-filed U.S. patent application Ser. No. 15/458,297 to Spath et al., entitled "Deposition system with modular deposition heads," which is incorporated herein by reference. In an exemplary arrangement, the gas manifold 25 is rigidly attached to the machine base, and has an attachment face including a plurality of manifold gas ports. The deposition head 30 includes a mounting face opposite to the output face 134, the mounting face including a plurality of deposition head gas ports corresponding to the manifold gas ports. Gas passages in the deposition head 30 connect the delivery head gas ports to openings on the output face 134. The mounting face of the deposition head 30 and the attachment face of the gas manifold 25 preferably include alignment features for aligning the deposition head 30 with the gas manifold 25. The deposition head 30 is rigidly fastened to the gas manifold 25 with sealing elements positioned between the manifold gas ports and the deposition head gas ports. The aforementioned U.S. patent application Ser. No. 15/458,297 also describes a variety of deposition unit configurations including multiple deposition heads 30. Such configurations can be used in place of the single manifold 25 and deposition head 30 arrangement illustrated in FIG. 5.

The motion actuator 16 includes a fixed portion 16a which is rigidly attached to the machine base 10 (via the pedestal 20), and a moveable portion 16b. The moveable portion 16b of the primary motion actuator 16 is adapted to translate in the in-track direction (i.e., the x-direction) during operation of the SALD system 200. A motion control system (not shown) is used to control the position of the moveable portion 16b in accordance with a defined motion pattern (thereby moving the substrate 97 relative to the deposition head 30 as will become clear in the following discussion). In preferred embodiments, the defined motion pattern is an oscillatory pattern where the substrate 97 is moved forward and backward in the in-track direction according to a repeating motion profile cycle. The face of the moveable portion 16b of the primary motion actuator 16 and the pedestal 20 include kinematic mounting features 18 to enable rapid and repeatable removal and installation of other components. The other components will have corresponding (or mating) kinematic mounting features on their attachment surface.

Kinematic mounting features 18 are those which are designed to exactly constrain two components relative to each other in precisely six degrees of freedom. These constrained degrees of freedom include translation in three mutually orthogonal planes as well as rotations about the three mutually perpendicular axes formed by the intersection of the three planes. Under constraint would allow for unintended motion about one or more of the unconstrained degrees of freedom, thus preventing precise relative alignment. Over constraint can cause deformation of one or both of the attached components also diminishing precision. When correctly implemented, the use of kinematic mounting features 18 allows for the removal and precise reinstallation of a component into a system.

There are numerous configurations of kinematic mounting features 18 known to one skilled in precision machine design, and any such configurations can be used in accordance with the present invention. One exemplary configuration that is well suited for use with the modular SALD system 200 disclosed here is a combination of three spheres, or hemispheres, rigidly fixed to one component of the pair, which mate with three corresponding V-grooves in the other component. In the exemplary apparatus, the spheres are individual bearing balls seated in conical depressions machined in the payload receiving component, namely the moveable portion 16b of the motion actuator, or likewise in the fixed pedestal 20. The ball bearings are chosen for their hardness and sphericity and make a circular ring contact tangent with the machined conical seat. The depth of the conical seat is such that the "equator" of the ball is above the plane of the face that the seat is machined into. The seat may be machined to appropriate depth using a tool such as a standard 60° center drill or common counter sink of 82° or 90° included angle. The ball may be retained by a low viscosity adhesive such as cyanoacrylate or methyl methacrylate that allows the ball to be seated with metal to metal contact. The balls may be simply captured in assembly and not further retained. Magnetic attraction may also be used to advantage. The arrangement of the balls can be at the apexes of an equilateral triangle or some other non-co-linear pattern.

The mating V-grooves can be machined into the second component using well known milling or grinding operations and appropriately shaped cutters. If the spherical elements (balls) are arranged in an equilateral triangular pattern, the V-grooves may advantageously have their long axes in a radial pattern, such a spokes of a wheel. The angle and depth of the V-grooves are such that the balls make tangential contact with the flanks of the V-grooves while the equators of the balls are above the plane of the second component (i.e., the payload). Each ball will make point contact with two planar flanks of the V-groove for a total of six contact points, and thereby the system will constrain exactly six degrees of freedom. A clamping force can be applied within the perimeter of the triangle prescribed by the ball centers, preferably near the center of an equilateral triangle. For example, the clamping force may be applied by a thumb screw or shoulder screw passing through the centroid of the contact points. A spring element, such as a coil spring or wave spring may be placed under the head of the screw to limit or make repeatable the applied clamping force.

Theoretical point contacts are practically realized as Hertzian contact patches, and it is known that deformation is reduced by the use of hard mating surfaces. Commercial components are available to create robust kinematic mounting systems by the use of particularly hard materials, such as bearing steels or carbides, and advantageous geometries which spread contact forces (such a "canoe spheres"). Hemispherical elements having threaded studs may be used in place of full balls in some implementations. It will be understood to those skilled in the art that in other configurations, other exact constrain arrangements can be used.

In the illustrated embodiment, the location and orientation of the kinematic mounting features 18 on the fixed pedestal 20 have mirror symmetry with the kinematic mounting features 18 on the motion actuator 16 about a vertical mid-plane through the deposition head 30. As illustrated, the elevation of the kinematic mount features 18 on the fixed pedestal 20 are the same as those of the motion actuator 16, however in alternative embodiments the pedestals 20, 21 can have an arbitrary height, and the distances required can be accounted for in the design of the mounted components.

Figure 6:
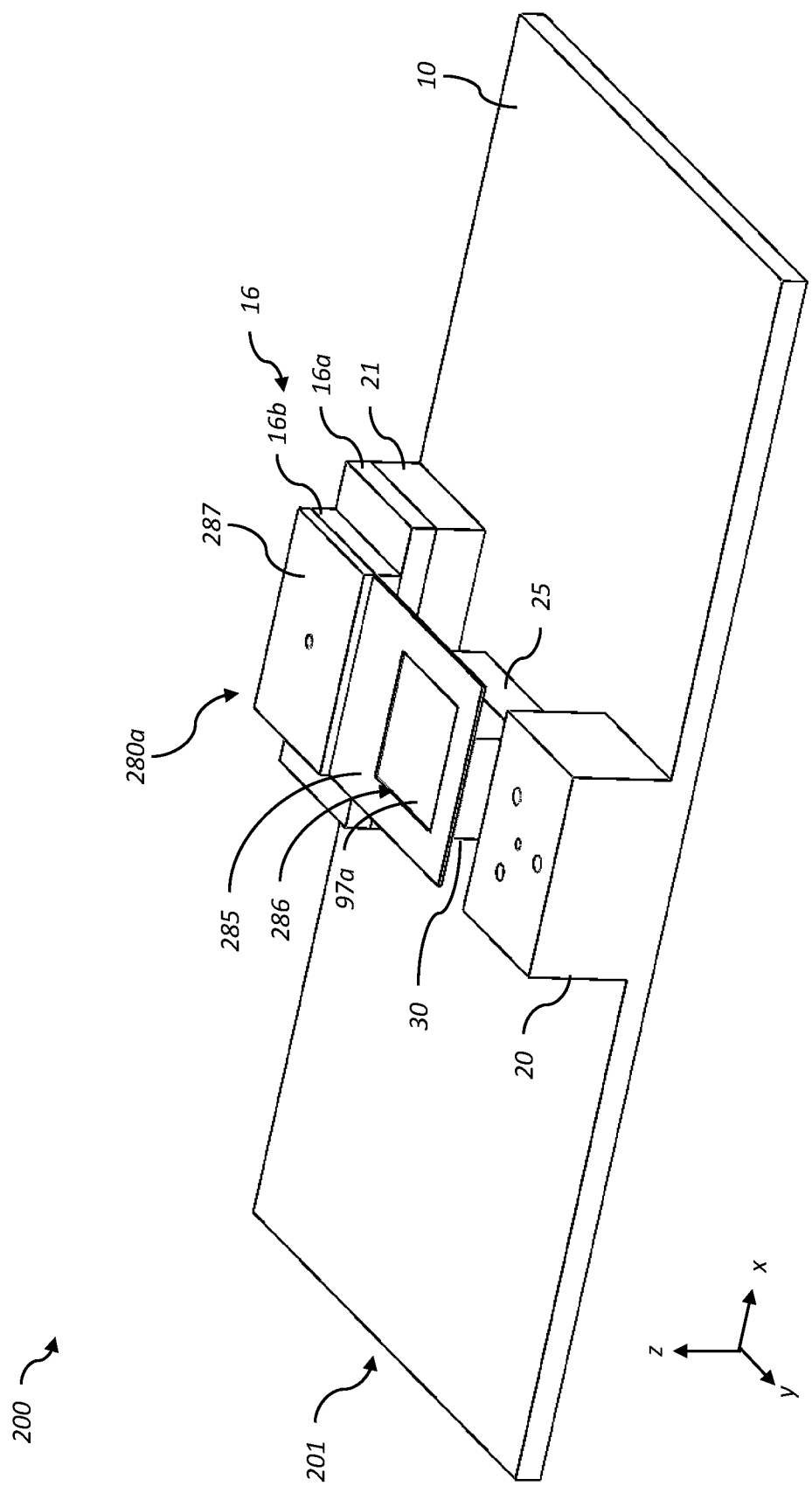
FIG. 6 shows the modular SALD system configured with a low-aspect-ratio rigid substrate positioner module for use with rigid substrates.

FIG. 6 illustrates a configuration of the modular SALD system using a low-aspect-ratio rigid substrate positioner module 280a adapted for use with low-aspect-ratio rigid substrates. In some embodiments, the modular SALD system 200 can have multiple low-aspect-ratio rigid substrate positioner modules 280a adapted for low-aspect-ratio rigid substrates, wherein each low-aspect-ratio rigid substrate positioner module 280a is designed to work with a substrate 97 of a specific form factor (i.e., dimension in the x-y plane). Within the context of the present disclosure, "low-aspect-ratio" substrates have an aspect ratio of between 1:1 and 2:1, inclusive, including substrates with circular shapes.

In the illustrated embodiment, the low-aspect-ratio rigid substrate positioner module 280a includes a positioning frame 285 and an attachment means 287 for attaching the low-aspect-ratio rigid substrate positioner module 280a to the primary motion actuator 16. The positioning frame 285 has a frame opening 286 (i.e., an aperture) adapted to receive a rigid substrate 97a of a specific size. The frame opening 286 confines the rigid substrate 97a such that its position is constrained laterally (i.e., in the x-y plane) but is free to move in the z-direction (i.e., the direction normal to the output face 134 of the deposition head 30).

In this arrangement, the relative movement of the substrate 97a and deposition head 30 is controlled by the movement of the moveable portion 16b of the primary motion actuator 16, which in turn moves the low-aspect-ratio rigid substrate positioner module 280a, which in turn moves the rigid substrate 97a. As described in the aforementioned U.S. patent application Ser. No. 15/458,297, the motion profile used can be chosen to be provide the appropriate sequencing of reactive and purge gases to perform the desired SALD deposition. In preferred embodiments, the deposition head 30 is a vacuum-preloaded gas bearing deposition head such as has been previously described. As illustrated, the rigid substrate 97a is unconstrained in the direction normal the deposition head 30, and the gap between the output face 134 of the deposition head 30 and the process side of the rigid substrate 97a is controlled by the gas flows through the vacuum-preloaded gas bearing deposition head 30 to advantageously ensure the separation of the reactive gasses, preventing undesired gas intermixing.

As illustrated in FIG. 6, the SALD modular system with a low-aspect-ratio rigid substrate module uses the pedestal 21 to match the installed elevation of the motion actuator 16 to the deposition head 30. The pedestal 20 is not used in this configuration but is still present as part of common mounting subsystem 201. (Pedestal 20 is positioned for use in other configurations, and is configured so as to not interfere with the other components during deposition.)

The low-aspect-ratio rigid substrate positioner module 280a is an embodiment of the interchangeable substrate positioner module 280 for rigid substrates 97a where substrate features engage with corresponding alignment features of the substrate position frame 285. As illustrated the alignment features are the perimeter of the frame opening 286 that rigid substrate 97a fits within. The rigid substrate 97a has sufficient thickness that it may be positioned by the close confinement of its perimeter within the perimeter of the frame opening 286. The plane of the positioning frame 285 is parallel to the plane of the motion actuator 16, which is parallel to the plane of the output face 134 (FIG. 5) of the deposition head 30. The kinematic mounting features 18 on the motion actuator 16 and corresponding features on the attachment means 287 of the low-aspect-ratio rigid substrate positioner module 280a maintain the parallelism of these components.

Figure 7:
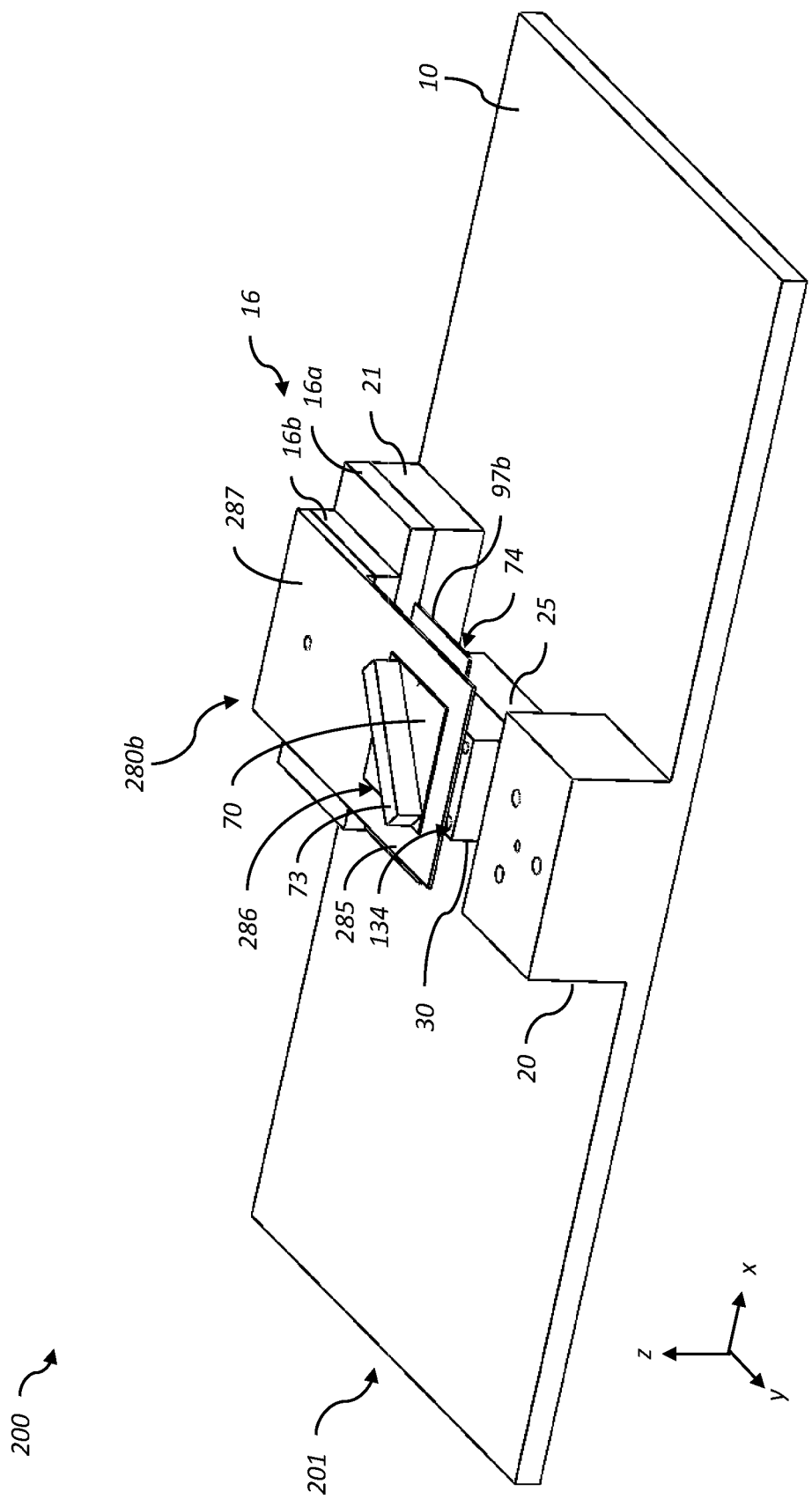
FIG. 7 shows the modular SALD system configured with a rigidly-attached-backer substrate positioner module 280b for use with substrate units including a backer device attached to a substrate.

FIG. 7 illustrates the modular SALD system 200 with a rigidly-attached-backer substrate positioner module 280b. The rigidly-attached-backer substrate positioner module 280b includes a positioning frame 285 attached to the motion actuator 16 by attachment means 287. The attachment means 287 has the same mating kinematic mounting features as all interchangeable substrate positioners 280 of the modular SALD system 200 of the present invention. The frame 285 has a frame opening 286 which is sized to receive a backer device 70. The substrate 97b is rigidly attached to backer device 70; attachment can be by any means known in the art including, adhesive, electrostatics or vacuum forces. The backer device 70 provides a load that urges the substrate 97b towards the deposition head 30. The backer device 70 is confined laterally (x-y plane) in the frame opening 286 but is free to move in a direction normal to the output face 134 (FIG. 5) of the deposition head 30 (i.e., in the z-direction). As illustrated in FIG. 7, substrate 97b can be larger than the backer device 70; in such cases, the substrate 97b is preferably rigid. In other configurations the backer device 70 and the substrate 97b can have approximately the same surface area; in such cases, the substrate 97b can be rigid or flexible. When the substrate 97b is flexible, the rigidly attached backer device 70 serves an additional function to stabilize the substrate 97b. As illustrated in FIG. 7, the substrate 97b is positioned under positioner frame 285, and as such the height of the frame 285 in the rigidly-attached-backer substrate positioner module 280b is set at a distance further from the output face 134 of the deposition head 30. The combination of the substrate 97b and the rigidly attached backer device 70 can be referred to as a substrate unit 74. The substrate unit 74 is unconstrained in the direction normal to the output face 134 of the deposition head 30. In preferred embodiments, the deposition head 30 is a vacuum-preloaded gas bearing SALD deposition head.

In the rigidly-attached-backer substrate positioner module 280b, the backer device 70 indirectly enables positioning of the substrate 97b in that the positioner frame opening 286 constrains the edges of the backer device 70 (rather than directly constraining the substrate 97b as was the case with low-aspect-ratio rigid substrate positioner module 280a). Preferably, the frame opening 286 contacts the edges of the backer device 70 in the same horizontal plane as center of mass of the substrate unit 74 (the combination of backer device 70 and substrate 97b), such that no pitching moments are imparted on the combined moving mass when accelerated by the motion of the rigidly-attached-backer substrate positioner module 280b in a plane parallel to the output face 134 of the deposition head 30. The illustrated frame opening 286 is one possible embodiment illustrating the interaction of the positioner frame 285 and backer device 70 in order to position the substrate unit 74 in an x-y plane over the output face 134 of the deposition head 30. Other forms of interactions between the rigidly-attached-backer substrate positioner module 280b and backer device 70 are considered to be within the scope of the current invention as long as it enables appropriately positioning the substrate unit 74. For example, in other embodiments the rigidly-attached-backer substrate positioner module 280b includes a positioner frame 285 that engages with other features of the backer device 70 rather than its outside perimeter. In one alternative embodiment, the engaging features include pins that extend vertically from the backer device 70 to engage with corresponding holes in the positioner frame 285. In alternative embodiments, the backer device 70 has features, such as tabs, that extend from the perimeter of the backer device 70 and engage with corresponding features in the positioner frame 285.

In some embodiments, the backer device 70 is also configured to act as a heat source or sink as a means to control the temperature of the substrate 97b. Heating energy can be imparted to the backer device 70 by any means known in the art. In the configuration shown in FIG. 7, the backer device 70 includes a cartridge heater 73 which supplies heat to the body of the backer device, and in turn to the substrate 97b. In other configurations, heat can be supplied to the backer device 70 using methods such as electric resistive elements, inductive electrical energy transfer and subsequent Joule heating, or direct inductive heating. Thermal electric (Seebeck/Peltier) modules may be used to heat or cool the backer. The backer device 70 can also be heated or cooled by flow of working fluids (convection, condensation, or evaporation) or by radiation.

In an exemplary configuration, the substrate 97b is attached to the backer device 70 with vacuum by means of a perforated, grooved, or porous backer surface facing the substrate 97b. In preferred embodiments, the feature size of the backer device 70 vacuum channel is designed consistent with the flexural stiffness of the substrate 97b in order to maintain the necessary planarity of the substrate. Other means of temporary attachment of the backer device 70 and substrate 97b include but are not limited to adhesives, phase change materials, electrostatic or magnetic forces, and edge clamping devices.

The weight of the backer device 70 can be used as a means to optimize the effective average pressure of the substrate 97b over the output face 134 of the deposition head 30. The backer device 70 may have additional additive or subtractive forces imparted by contact or non-contact connections to the rigidly-attached-backer substrate positioner module 280b. Preferably the substrate unit 74 is positioned vertically above the horizontal plane of the output face 134 of the deposition head 30 such that the combined mass of the backer device 70 plus the substrate 97b, combined with the influence of gravity provides a constant force on the substrate 97b in the direction normal to the output face 134 of the deposition head 30.

In this embodiment, the substrate unit 74 is caused to move in a plane parallel to the output face 134 of the deposition head 30 by displacement of the moveable portion 16b of the primary motion actuator 16, and should be understood from the description relative to FIG. 6. In preferred embodiments, the substrate unit 74 can be moved to a position where even the center of gravity of the substrate unit 74 is beyond the edge of the deposition head 30 as described in commonly-assigned, co-filed U.S. patent application Ser. No. 15/458,250 to Spath et al., entitled "Deposition system with vacuum pre-loaded deposition head," which is incorporated herein by reference. In such embodiments, a vacuum-preloaded deposition head 30 is used to provide support for the substrate unit 74 in the overhang position.

Figure 8:
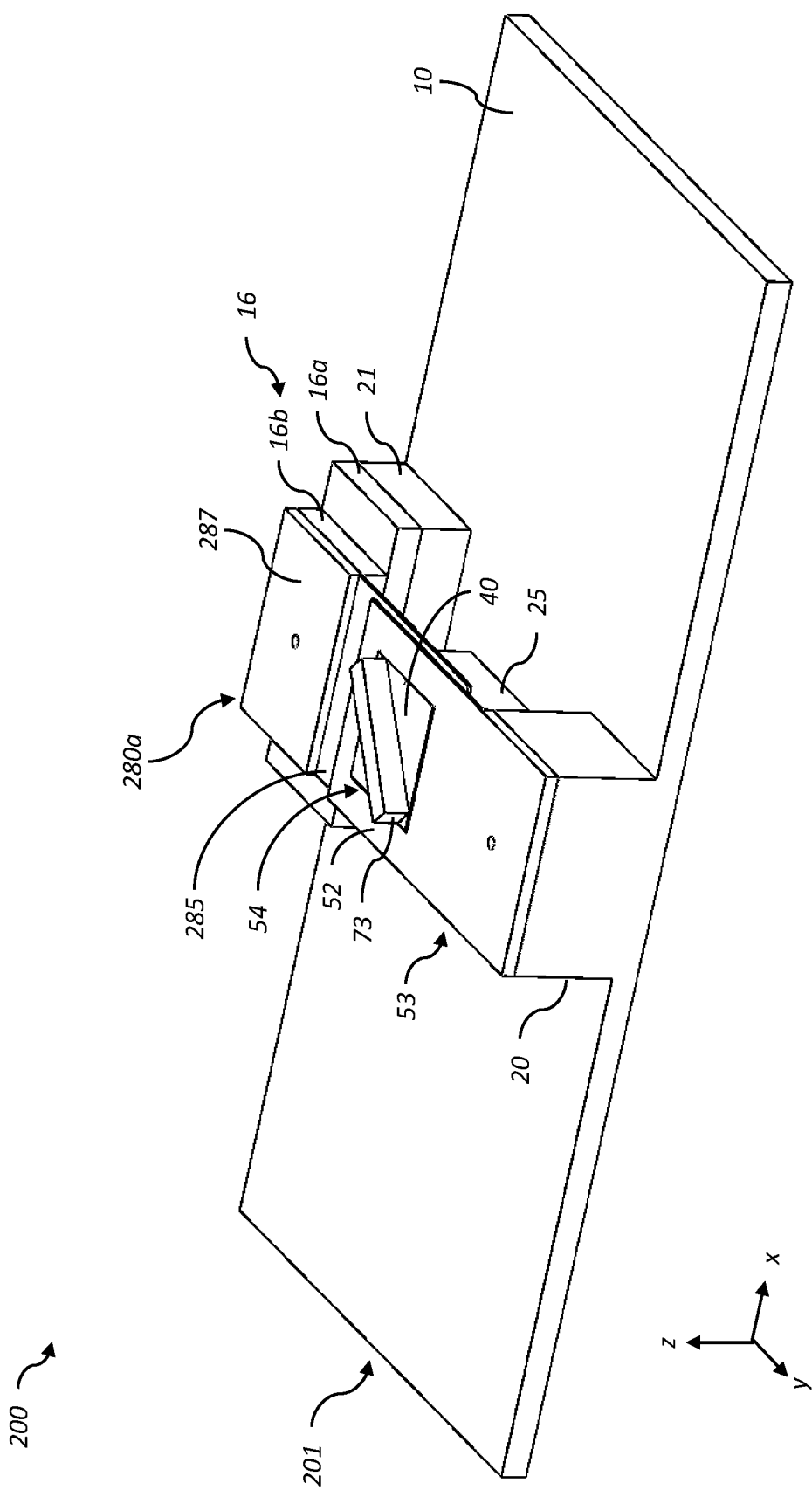
FIG. 8 shows the modular SALD system configured with the low-aspect-ratio rigid substrate positioner module and a gas-bearing backer positioned using a stationary positioning frame.

FIG. 8 illustrates another configuration of the modular SALD system of the present invention using the low-aspect-ratio rigid substrate positioner module 280a that was discussed relative to FIG. 6, together with a gas-bearing backer 40 which is constrained to remain in a fixed lateral position but is freely moveable in a vertical direction (i.e., the direction normal to the output face 134 of the deposition head 30 (not visible in FIG. 8)). In an exemplary embodiment, the gas-bearing backer 40 is of the type described in commonly-assigned, co-filed U.S. patent application Ser. No. 15/458,307 to Spath, entitled "Porous gas-bearing backer," which is incorporated herein by reference. This embodiment features a stacked arrangement including a fixed vacuum-preloaded deposition head 30, a moveable substrate 97 (not visible in FIG. 8), and a gas-bearing backer 40 that is freely moveable in a vertical direction. In this configuration, the substrate 97 can be rigid or flexible.

In the embodiment illustrated in FIG. 8, the positioning frame 285 controls the movement of the substrate 97 (not visible in this figure) as was described with respect to FIG. 6. The gas-bearing backer 40, however, is not in contact with the substrate 97 and does not move with the substrate 97. Instead, the gas-bearing backer 40 is separated from the backside of the substrate 97 by a gap formed by the gas flow from the gas-bearing backer 40 as described in commonly-assigned, co-filed U.S. patent application Ser. No. 15/458,262 to Spath, entitled "Dual gas bearing substrate positioning system," which is incorporated herein by reference. A lateral constraint system 53 is used to constrain the gas-bearing backer 40 laterally (i.e., in the x-y plane) while enabling it to freely move in the direction normal to the output face 134 of the deposition head 30 (i.e., the z-direction). In the illustrated configuration, the lateral constraint system 53 includes a stationary positioning frame 52 having a frame opening 54 (i.e., an aperture) that the gas-bearing backer 40 fits within. The lateral constraint system 53 is attached to the pedestal 20 in a fixed location (using the kinematic mounting features 18 (FIG. 5). The lateral constraint system 53 positions the gas-bearing backer 40 over the deposition head 30. The stationary positioning frame 52 is at a higher elevation than the substrate positioning frame 285 so that the substrate positioning frame 285 has clearance to move laterally between the positioning frame 53 and the output face 134 of the deposition head 30. The position of the gas-bearing backer 40 is constrained against lateral motion relative to the output face 134 (i.e., motion in the x-y plane) and is constrained against rotational motion about an axis normal to the output face 134 (i.e., rotation around the z-axis) by interaction with the stationary positioning frame 52. The interaction of the gas-bearing backer 40 with the stationary positioning frame 52 can be through a frame opening 54 as illustrated in FIG. 8, or by any other type of engagement features that constrain the motion in the x-y plane, while allowing for motion in the direction normal to the output face 134 of the deposition head 30. In this configuration, the gas-bearing backer 40 is free to seek an equilibrium position in the direction normal to the output face 134.

In the modular SALD system 200 of the present invention, the rigidly-mounted deposition head 30 establishes a fixed reference plane for the substrate transport mechanics. Gravity provides a stable and constant force on the substrate 97. The gas-bearing backer 40 is free to move in a direction normal to the deposition face 134 of the deposition head 30, for example, to compensate for varying substrate thickness. The low-aspect-ratio rigid substrate positioner module 280a is moveable in the in-track direction of the primary motion actuator 16 without interference with the lateral constraint system 53. The gas-bearing backer 40 provides additional functions of flattening and stiffening the substrate 97 and also heat transfer functionality from a heater 73 as described earlier. In this exemplary configuration, the gas-bearing backer 40 is self-supported above the substrate 97 on a gas film emanating from the gas-bearing backer 40 and provides a nearly constant net force on the substrate 97. The so-called vertical stack consisting of the deposition head 30, the substrate 97, and the gas-bearing backer 40 provides a particularly robust system for SALD as discussed in the aforementioned U.S. patent application Ser. No. 15/458,262.

Additional similar embodiments of the modular SALD system 200 can benefit from a gas-bearing backer 40 that remains in a stationary position in a plane parallel to the output face 134 of the deposition head 30, including configurations intended to convey high-aspect-ratio substrates 97 (e.g., substrates having an aspect ratio greater than 2:1, inclusive, such that the in-track length is at least 2× the cross-track coating width) of a rigid or flexible material, large substrates of arbitrary aspect ratio where the in-track length of the substrate 97 is at least 2× the in-track length of the output face 134 of the deposition head 30, and particularly those that convey a continuous flexible substrate.

Figure 9:
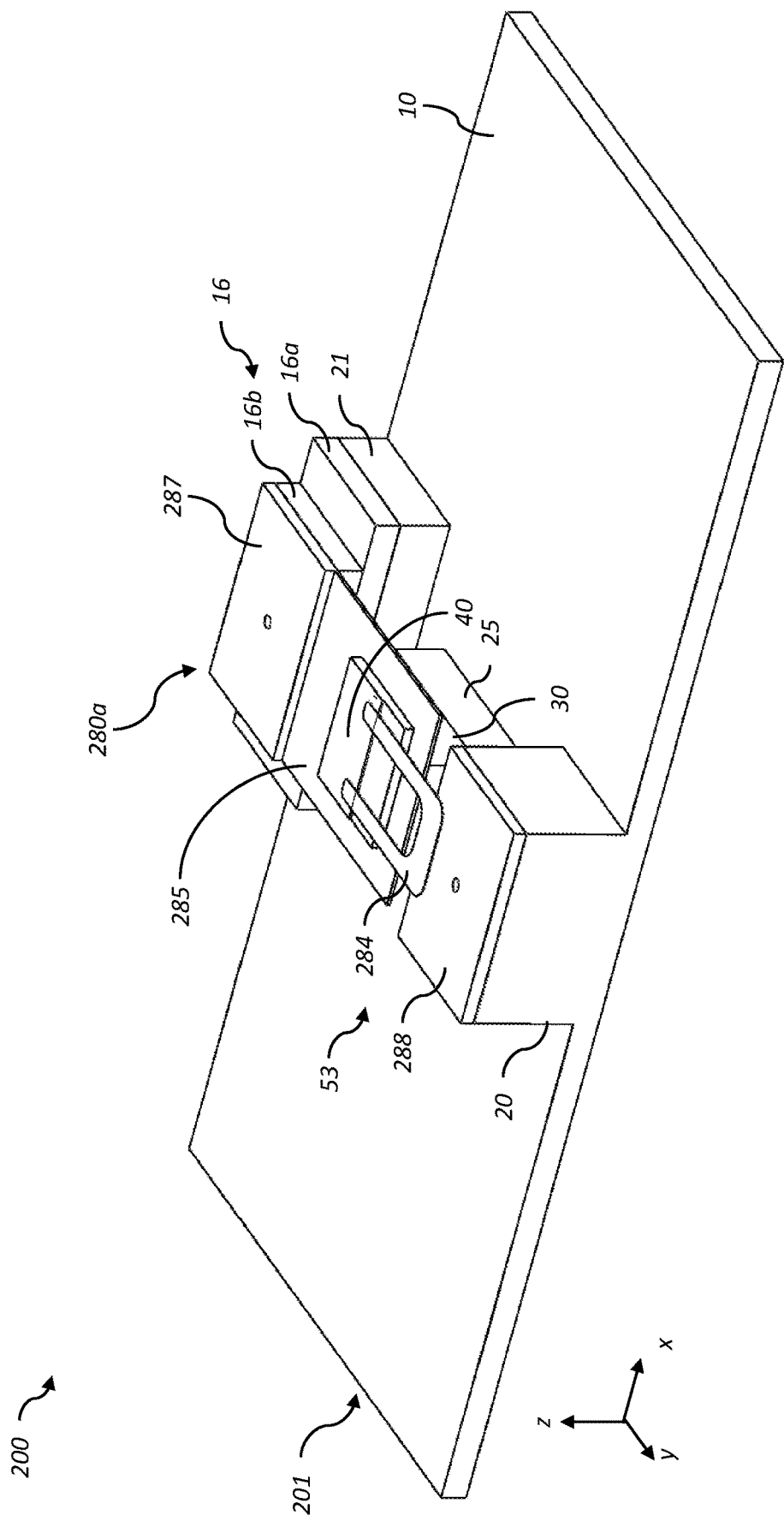
FIG. 9 shows the modular SALD system configured with the low-aspect-ratio rigid substrate positioner module and a gas-bearing backer positioned using a flexure.

FIG. 9 illustrates another exemplary configuration for the lateral constraint system 53. In this case, the lateral position of the gas-bearing backer 40 is constrained by a flexure 284, which is attached to the pedestal 20 using an attachment mechanism 288. The flexure 284 flexes to enable the gas-bearing backer 40 to freely move in a direction normal to the output face 134 of the deposition head 30 while constraining the lateral position of the gas-bearing backer 40 in the x-y plane. In some embodiments, the flexure 284 can be advantageously utilized to deliver electrical energy or fluid flows to the gas-bearing backer 40 (e.g., to provide energy to a heater and/or to provide a gas flow to the gas-bearing surface.)

Figure 10:
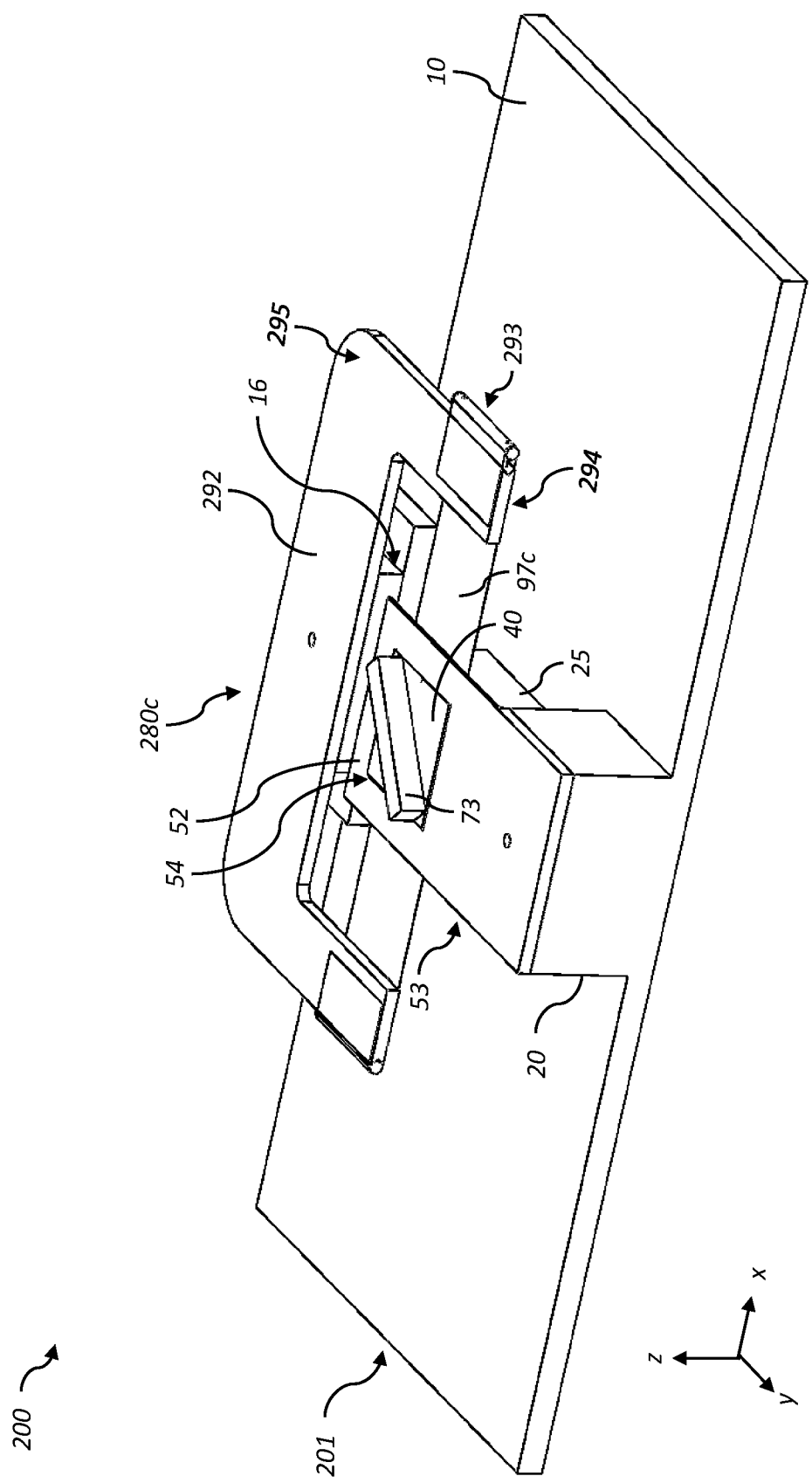
FIG. 10 shows the modular SALD system configured with a high-aspect-ratio substrate positioner module including a C-frame substrate holder for use with substrates having a high aspect ratio.

FIG. 10 illustrates another configuration of the modular SALD system 200 of the present invention with a high-aspect-ratio substrate positioner module 280c. The high-aspect-ratio substrate positioner module 280c includes of a C-frame substrate holder 292 attached to the primary motion actuator 16 via the kinematic mounting features 18 (FIG. 5). The C-frame substrate holder 292 holds a high-aspect-ratio substrate 97c (e.g., a flexible strip of substrate or a high-aspect ratio rigid substrate) and controls the movement of the high-aspect-ratio substrate 97c via the engagement with the motion actuator 16. The gas-bearing backer 40 is confined by the frame opening 54 in the stationary positioning frame 52 as was described in relationship to FIG. 8. The high-aspect-ratio substrate positioner module 280c moveable in the direction of the primary motion actuator without interference with the lateral constraint system 53 for the gas-bearing backer 40.

The C-frame substrate holder 292 is designed to hold a high-aspect-ratio substrate 97c having a length substantially (e.g., 2x or more) larger than the in-track dimension of the output face 134 of the deposition head 30 (see FIG. 5). The high-aspect-ratio substrate 97c used with the C-frame substrate holder 292 can be either partially or fully flexible, with preferred embodiments being used to coat a segment of a flexible web. As shown in FIG. 10, the C-frame substrate holder 292 has clamping features 293 at each end to align and clamp the high-aspect-ratio substrate 97c to the C-frame substrate holder 292. Such clamping features 293 can include clamping bars, spring clips, magnets, cam locks, wedges, or other mechanisms known to one skilled in mechanical design. An emphasis on low mass is desirable to allow for rapid acceleration of the substrate and frame. The C-frame substrate holder 292 can also include web tensioning elements such as springs or elastic components, magnetic devices etc. The illustrated configuration shows an example where the clamping features 293 are spring biased turning bars. When used with a flexible web, it is desirable that web tension be controllable to low levels, for example less than 1 lbf per linear inch width or less, such that tensile creep of the high-aspect-ratio substrate 97c is minimized during processing, particularly at elevated temperatures. As illustrated, the C-frame substrate holder 292 holds the substrate nominally parallel to and slightly above the output face 134 of the deposition head 30 (see FIG. 5). In the illustrated configuration, the high-aspect-ratio substrate 97c is securely wrapped around a bottom surface 294 of the C-frame substrate holder 292.

The web pick-off angle should be limited to prevent the vertical component of web tension from becoming a substantial disturbance at the extremes of the substrate travel. The disturbing force is a function of the web pick-off angle and the web tension. The disturbing force is preferentially limited during operation to be less than 50% of the force imparted by the gas-bearing backer 40 (i.e., the backer weight). It is most preferred that the disturbing force does not exceed the vacuum preload force imparted on the web by the deposition head 30 when the backer force is not present.

Figure 11:
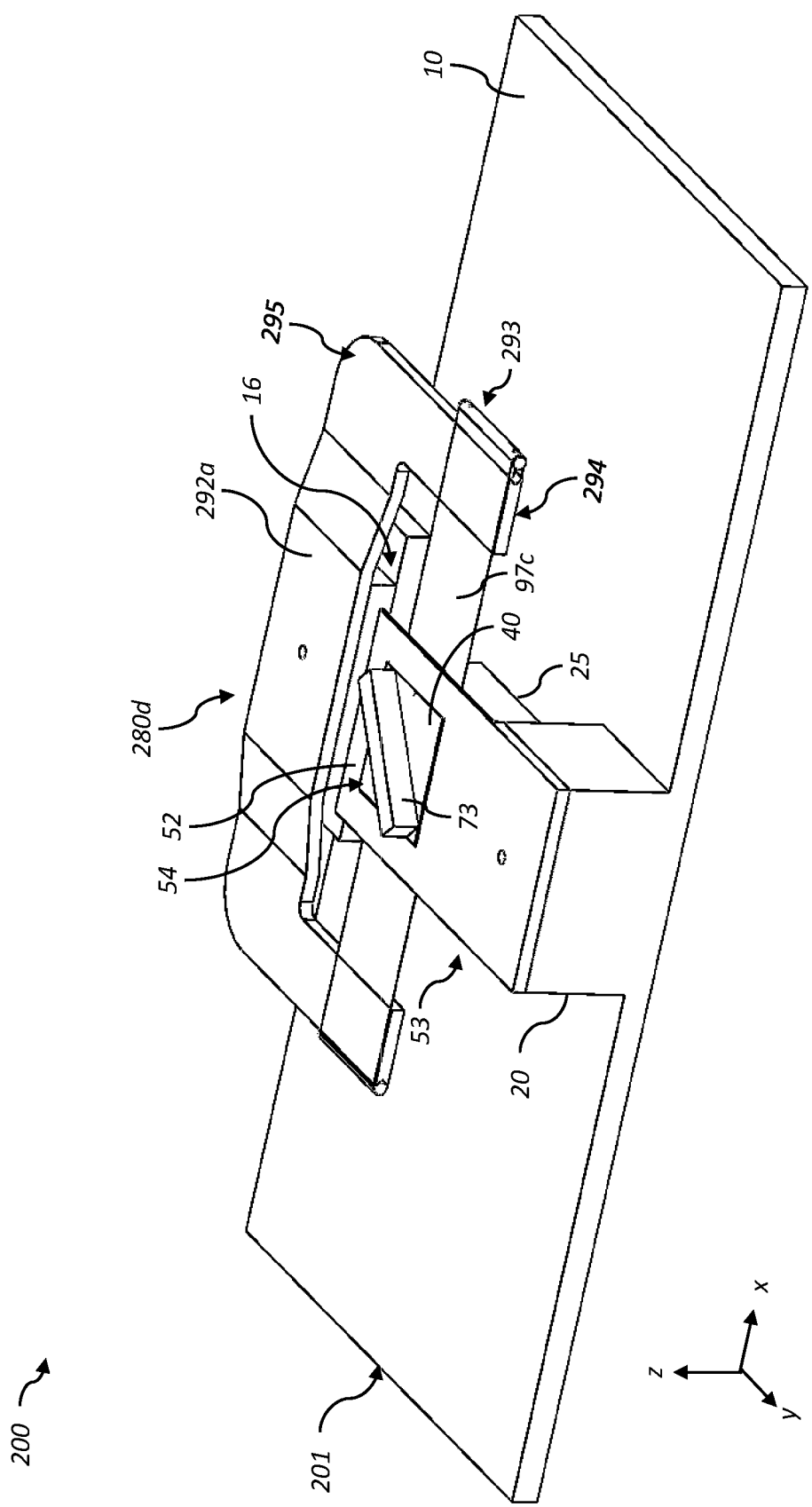
FIG. 11 shows the modular SALD system configured similarly to FIG. 10 with an alternate high-aspect-ratio substrate positioner module.

FIG. 11 illustrates an alternative high-aspect-ratio substrate positioner module 280d for the modular SALD system 200. The components of high-aspect-ratio substrate positioner module 280d are analogous to those of the high-aspect-ratio substrate positioner module 280c of FIG. 10 and should be understood from the previous description. In the high-aspect-ratio substrate positioner module 280, there is a change in the design of the C-frame substrate holder 292a. In this configuration, the ends of the C-frame substrate holder 292a are lowered and the high-aspect-ratio substrate 97c is securely wrapped around the upper surface 295 of the C-frame substrate holder 292a. As illustrated the installed C-frame substrate holder 292 holds the high-aspect-ratio substrate 97c such that its working side (i.e., the bottom surface) is nominally coplanar with or slightly above the output face 134 of the deposition head 30. This is facilitated by having the working side of the high-aspect-ratio substrate 97c contact the upper surface 295 of the C-frame substrate holder 292a, which serves as a reference surface, such that the planar alignment with the output face 134 of the deposition head 30 is constant and independent of substrate thickness.

Figure 12A:
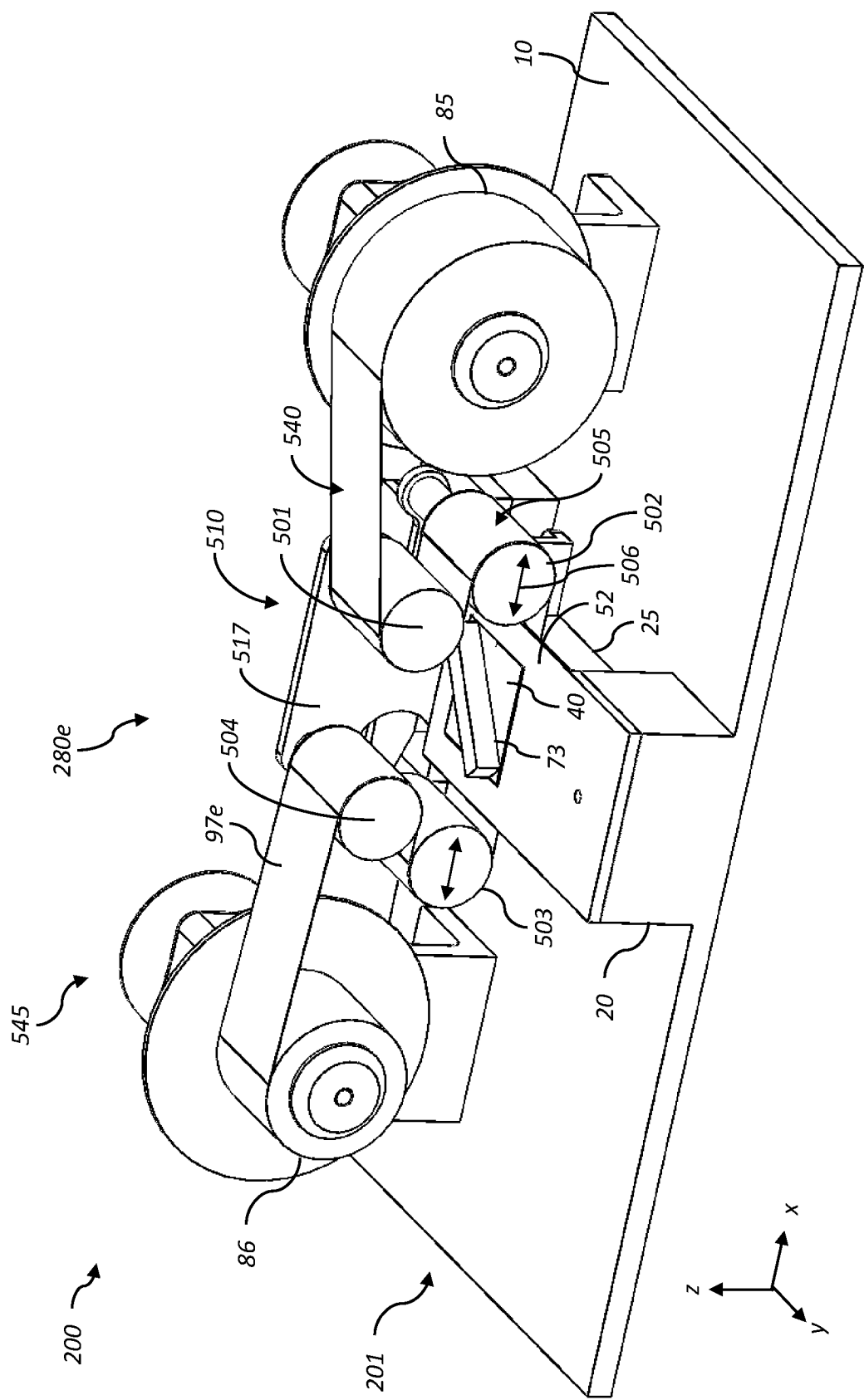
FIGS. 12A and 12B are a front-view and a rear-view, respectively, of the modular SALD system configured with a roll-to-roll substrate positioner module for use with web substrates.
Figure 12B:
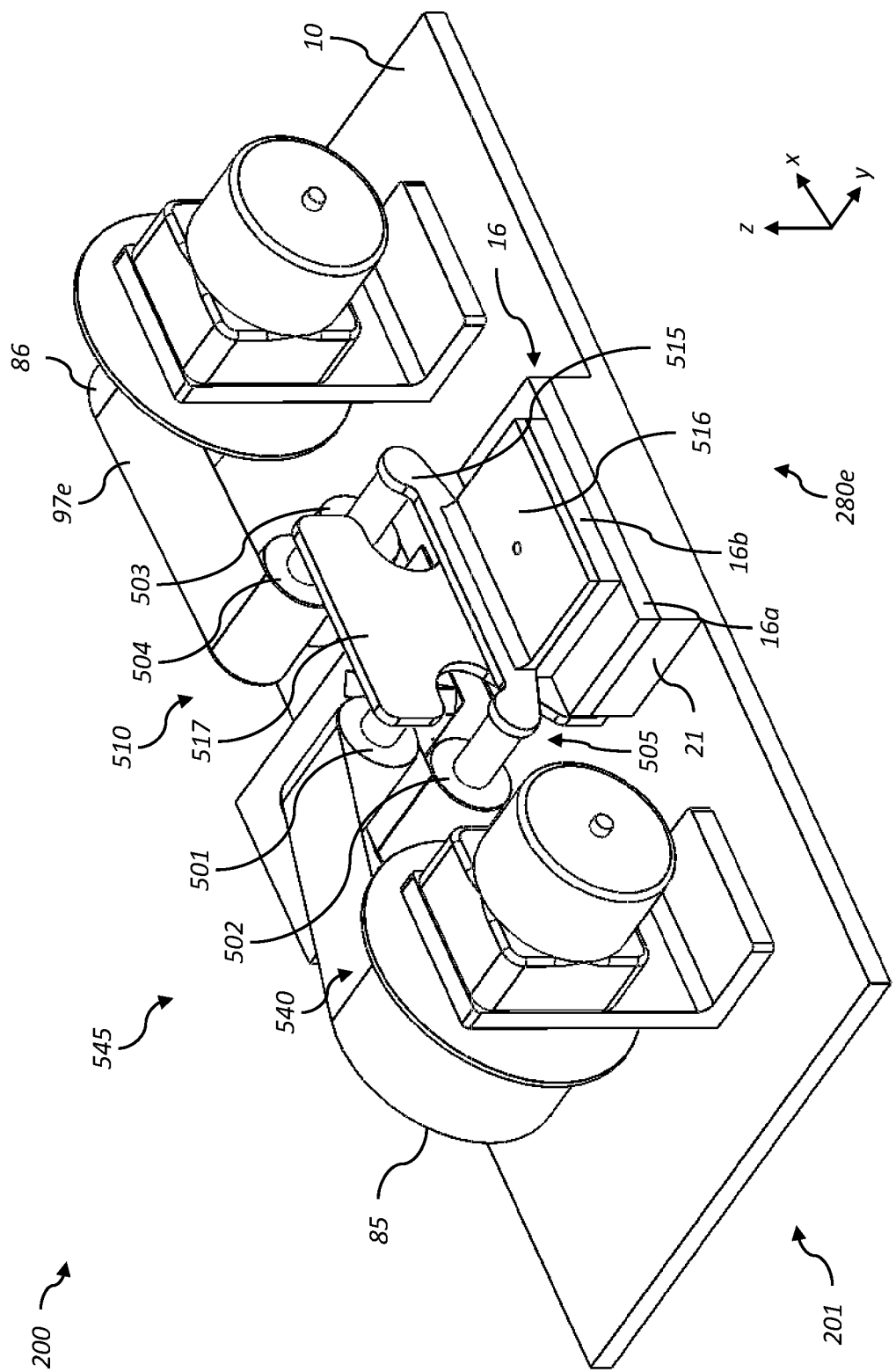

FIGS. 12A and 12B illustrate another configuration of the modular SALD system 200 of the present invention using a roll-to-roll substrate positioner module 280e. (FIG. 12B is an isometric view from the other side relative to FIG. 12A to facilitate visibility of occluded parts.) This configuration is an implementation of the roll-to-roll SALD deposition system described in commonly-assigned, co-filed U.S. patent application Ser. No. 15/458,270 to Spath et al., entitled "Deposition system with moveable-position web guides," which is incorporated herein by reference. In this configuration, a web transport system 545 transports a web substrate 97e (i.e., a continuous web of flexible substrate) along a web transport path 540 from a supply roll 85 to a take-up roll 86. The web transport system 545 includes a fixed portion 510 having a fixed position relative to the machine base 10, and a moveable portion 505 that is moved by the motion actuator 16. The fixed portion 510 includes fixed-position web guides 501, 504, and the moveable portion 505 includes moveable-position web guides 502, 503. The web transport path 540 carries the web substrate 97e from the supply roll 85 around a first fixed-position web guide 501, then around a first moveable-position web guide 502 and past the output face 134 of the deposition head 30, then around a second moveable-position web guide 503, then around a second fixed-position web guide 504 and to the take-up roll 86. A gas-bearing backer 40 (previously discussed relative to FIG. 8) is used to advantageously flatten any distortions that the gas flows of the deposition head 30 may impart to the web substrate 97e in the process region. A heater 73 is optionally used to heat the gas-bearing backer 40, which in turn will heat the web substrate 97e in the process region.

The roll-to-roll substrate positioner module 280e includes the moveable portion 505 of the web transport system 545. In the illustrated configuration, the roll-to-roll substrate positioner module 280e includes a carriage 515 onto which the moveable-position web guides 502, 503 are mounted. It also includes a mounting feature 516 which is attached to the moveable portion 16b of the motion actuator 16. In preferred embodiments, the mounting feature 516 includes mounting features that mate with the kinematic mounting features 18 of the motion actuator 16. As discussed in more detail in the aforementioned U.S. patent application Ser. No. 15/458,270, in preferred embodiments, the first and second moveable-position web guides 502, 503 are web turning devices such as rollers or gas turn bars. In some configurations, the moveable-position web guides 502, 503 are portions of a monolithic moveable structure.

The web substrate 97e along the portion of the web-transport path 540 between the moveable-position web guides 502, 503 is nominally parallel to the output face 134 of the deposition head 30 when the roll-to-roll substrate positioner module 280e is mounted to the primary motion actuator 16. Preferably, the process side of the web substrate 97e along this portion of the web transport path 540 is spaced apart from the output face 134 of the deposition head 30 during operation of the SALD system 200 by a gap of no more than about 20 μm. (This gap is typically controlled by the gas flows through the SALD deposition head 30, which is preferably a vacuum-preloaded gas bearing deposition head.) The first and second moveable moveable-position web guides 502, 503 (web turning devices) are positioned on either side of the deposition head 30 with sufficient clearance to allow for lateral motion (via the motion actuator 16) without collision of the first and second moveable-position web guides 502, 503 and the deposition head 30 or other system components.

The fixed-position web guides 501, 504 are attached to a sub-frame 517, and are preferably web turning devices, such as rollers or gas turn bars. The sub-frame 517 is mounted directly to the machine base 10 on the same side as the primary motion actuator 16. As illustrated, other components for roll-to-roll web handling including the supply roll 85 and the take-up roll 86 are also mounted to the machine base 10.

As discussed in more detail in the aforementioned U.S. patent application Ser. No. 15/458,270, during operation a web transport control system (not shown) is used to advance the web substrate 97e along the web transport path 540 at a constant web velocity. The motion actuator 16 is then used to translate the roll-to-roll substrate positioner module 280e including moveable portion 505 forward and backward over the deposition head in motion direction 506 an oscillatory motion pattern. Preferably, the wrap angle of the web substrate 97e around the first and second moveable-position web guides 502, 503 is substantially equal to 180° (i.e., equal to within ±10 degrees, and more preferably to within ±5 degrees), which will ensure that the web transport path 540 will have a constant length regardless of movements of the moveable portion 505 by the motion actuator 16. Said another way, the web substrate 97e enters and exits the first and second moveable-position web guides 502, 503 in directions that are substantially parallel to the motion direction 506 of the moveable portion 505. The combination of the continuous web motion provided by the web transport control system with the oscillatory motion of the moveable portion 505 results in moving the web substrate 97e over the deposition head 30 in an "ooching" motion pattern as described in the aforementioned U.S. patent application Ser. No. 15/458,287.

It should be understood that alternative embodiments of the moveable portion 505, such as those described in the aforementioned U.S. patent application Ser. No. 15/458,270, can also be used in the modular SALD system 200 of the present invention by including the appropriate moveable components as part of the roll-to-roll substrate positioner module 280e.

Figure 13A:
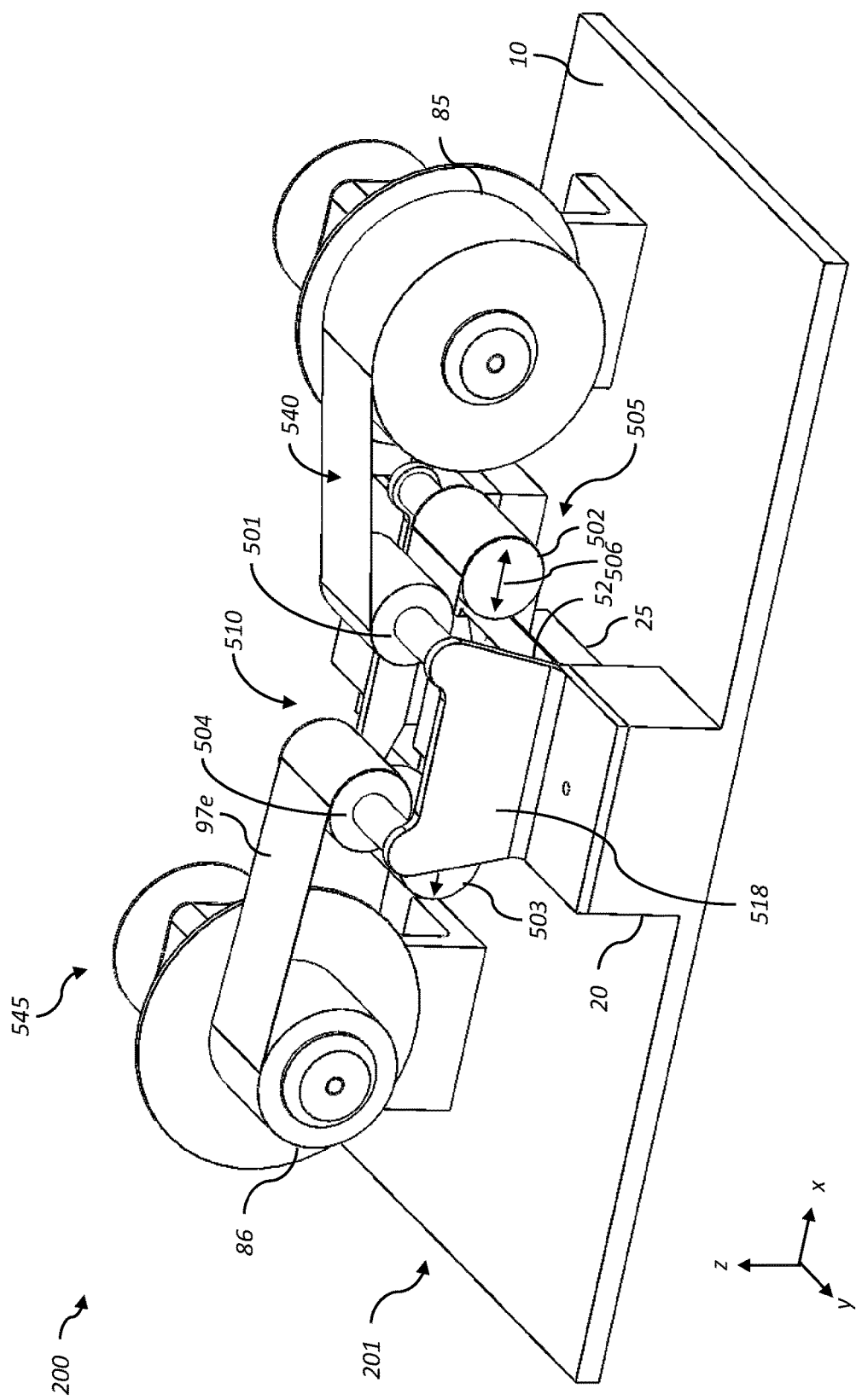
FIGS. 13A and 13B are a front-view and a rear-view, respectively, of an alternative configuration of the modular SALD system using the roll-to-roll substrate positioner module.
Figure 13B:
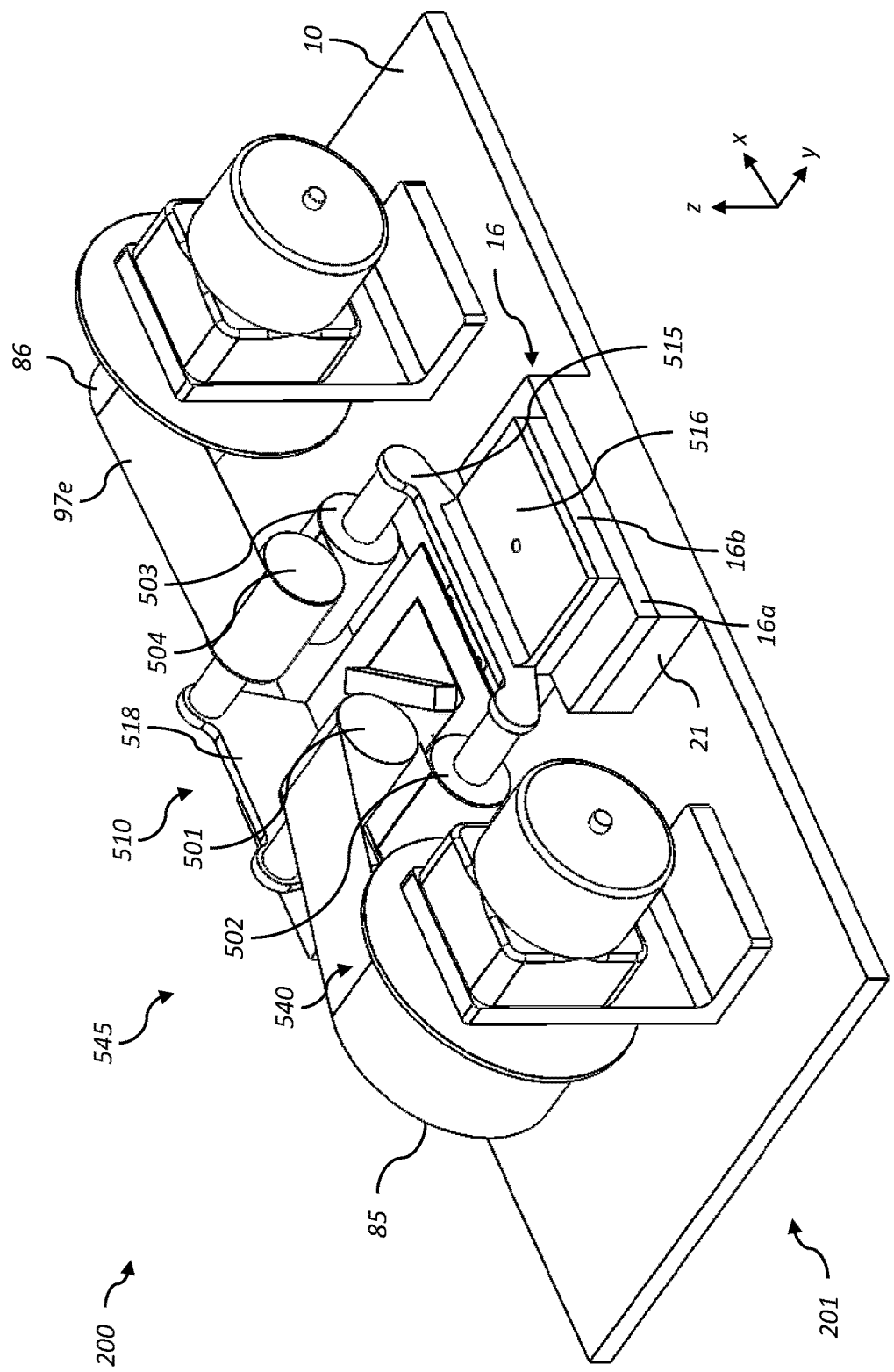

FIGS. 13A and 13B illustrate an alternate embodiment of the roll-to-roll processing configuration for the SALD system 200. In this variation, the fixed-position web guides 501, 504 are attached to the pedestal 20 using a sub-frame 518. Accordingly, the fixed-position web guides 501, 504 are attached to the machine base 10 on the opposite side of the deposition head 30 (not visible in these figures) from the motion actuator 16, which is mounted on the pedestal 21. In this configuration, the sub-frame 518 has mating kinematic mounting features which are adapted to connect to the kinematic mounting features 18 on the pedestal 20. All other components are equivalent to those described with respect to FIGS. 12A-12B.

As previously discussed, in the configurations of both FIGS. 12A-12B and 13A-13B, a web transport control system (not shown) is used to advance the web substrate 97e along the web transport path 540 at a nominally constant steady-state web velocity with respect to the fixed-position web guides 501, 504. This motion is independent of the motion of the moveable portion 505 which is controlled by the motion actuator 16. In a preferred arrangement, in addition to controlling web velocity, the web transport control system also provides web tension control, which is facilitated by including appropriate web tension control components in the design of the web transport system 545.

Motion of the primary motion actuator may be arbitrarily complex. As stated earlier, the motion control for high-aspect ratio substrate and the roll-to-roll configuration is unique because the roll-to-roll system requires the rapid back and forth motion (ooching) needed for spatial atomic layer deposition (which is common with all configurations) as well as a slower and relatively steady movement of the substrate from in source roll to the finished roll. A web transport with oscillating rollers is especially well suited to this requirement and was previously described in detail.

The mounting system for the deposition head 30 is reused in all of the above described configurations of modular SALD system 200. This is done by keeping the deposition head 30 in a fixed location with unbroken gas connections for all configurations. No moving seals or flexible gas lines are required. When required, the deposition head 30 can be removed and reattached in a repeatable position for periodic maintenance. Preferably, the mounting face of the deposition head 30 and the attachment face of the gas manifold 25 include alignment features for aligning the deposition head 30 with the gas manifold 25 to enable positioning the gas manifold 30 in a repeatable position. The machine base 10 may optionally have passages which act as a manifold for effective routing and isolation of various gas flows to and from the deposition head 30.

Preferably, gas connections may be made simultaneously through gas ports on the gas manifold 25 and corresponding gas ports on the mounting face of the deposition head 30. Gas passages in the deposition head 30 connect the deposition head gas ports to corresponding openings on the output face 134 to deliver gas flows to/from the output face. Preferably, as described in the aforementioned U.S. patent application Ser. No. 15/458,297, the deposition head gas ports and the manifold gas ports are sealed simultaneously by one or more gaskets interposed between the manifold 25 and the deposition head 30, wherein the gaskets provide annular seals for multiple gas ports within a single gasket, and optionally include alignment features such as holes or edges. Most preferably, the gasket should be constructed to provide a deterministic installed thickness such that the plane of the output face 134 of the deposition head 30 is at a controlled elevation with respect to the machine base 10. Such functions may be accomplished by having a gasket with crushable corrugated sealing features and a non-crushable web. Alternatively, the gaskets may be comprised of malleable sheet material which is penetrated by local ridge features on the manifold and deposition head mounting faces. Alternatively, gas connections may be made to individual ports on the periphery of the deposition head 30 on faces that are accessible while the deposition head 30 is mounted to the machine base 10. Such gas connections should not infringe on the plane of the output face 134 of the deposition head 30 within a tolerance where they would interfere with the substrate or substrate positioner throughout the extremes of motion of the motion actuator 16. The gas manifold system can also include gas control devices (e.g. orifices, needle valves, pressure regulators, mass flow controllers) either integrated within the machine base 10 or manifold 25 or at a remote position. The gas control devices are preferably modular to enable expansion, and preferably include mass flow controlled sources and vacuum regulated exhausts.

In alternative embodiments, the modular SALD system 200 can include multiple deposition heads 30 in either the cross-track direction to coat on wider substrates, or the in-track direction for more complex coating schedules, or in both the cross-track and in-track directions. As discussed in the aforementioned U.S. patent application Ser. No. 15/458,297, in these embodiments multiple deposition heads are preferably mounted to a common manifold. One preferred solution for a wider-coating modular SALD system uses multiple interlocking heads such as those discussed in commonly-assigned, co-pending U.S. patent application Ser. No. 15/458,322 to Tutt et al., entitled "Deposition system with interlocking deposition heads," which is incorporated herein by reference. The use of a common manifold 25 capable of supporting multiple deposition heads 30, together with the use of the blanking plates to block any unused interface regions, increases the latitude of different substrate form factors that can be coated with the modular SALD system 200 of the present invention.

An advantage of the modular SALD system 200 of the present invention is that it can be configured to accommodate a wide variety of different substrates 97 of different types and form factors. Many of the system components are common across multiple system configurations. For example, the same mounting subsystem 201, deposition head 30 and motion actuator 16 is used across all of the illustrated configurations. Other components are reused in a plurality of different configurations. For example, the same low-aspect-ratio rigid substrate positioner module 280a is used in the configuration of FIGS. 6 and 8 for substrates having the same form-factor. Similarly, the backer positioning frame 285 in FIGS. 7 and 8 can be the same part if the backer device 70 and the gas-bearing backer 40 have the same form factor.

Although the present invention was described in relationship to preferred embodiments utilizing a vacuum-preloaded gas-bearing SALD deposition head 30, it is not required that the modular system of the present invention include this feature. Alternative embodiments include modular deposition systems having interchangeable components which use other deposition head configurations, including non-vacuum-preloaded gas bearing designs, as well as deposition system designs utilizing mechanical constraints rather than a process-side gas bearing to set the distance between the output face of the deposition head 30 and the process-side of the substrate 97. While the exemplary configurations show horizontal substrate orientations, this is not a requirement. For example, vertically oriented substrate configurations can be used such as those described in common-assigned, co-pending U.S. patent application Ser. No. 15/458,335 to Spath et al., entitled "Vertical system with vacuum pre-loaded deposition head," which is incorporated herein by reference. Furthermore, the interchangeable modular system of the present invention is not limited to having a single deposition unit; multiple units are also considered as part of the current invention and can be installed "in-line" for sequential process-stations or arranged to coat opposite sides of the substrate 97.

The invention has been described in detail with particular reference to certain preferred embodiments thereof, but it will be understood that variations and modifications can be effected within the spirit and scope of the invention.

PARTS LIST 10 machine base
15 external environment
16 motion actuator
16a fixed portion
16b moveable portion
18 kinematic mounting features
20 pedestal
21 pedestal
25 manifold
30 deposition head
40 gas-bearing backer
52 stationary positioning frame
53 lateral constraint system
54 frame opening
70 backer device
73 heater
74 substrate unit
85 supply roll
86 take-up roll
94 working distance
97 substrate
97a rigid substrate
97b substrate
97c high-aspect-ratio substrate
97e web substrate 98 motion arrow
110 gas slot
112 output slot
114 exhaust slot
134 output face
200 SALD system
201 mounting subsystem
205 deposition subsystem
210 deposition unit
270 relative motion means
280 substrate positioner module
280a low-aspect-ratio rigid substrate positioner module
280b rigidly-attached-backer substrate positioner module
280c high-aspect-ratio substrate positioner module
280d high-aspect-ratio substrate positioner module
280e roll-to-roll substrate positioner module
284 flexure
285 frame
286 frame opening
287 attachment means
288 attachment mechanism
292 C-frame substrate holder
292a C-frame substrate holder
293 clamping feature
294 bottom surface
295 upper surface
305 deposition zone
308 inert zone
309 inert zone
313 first reactive gas zone
314 purge zone
315 second reactive gas zone
321 left edge
322 right edge
401 output slots
501 fixed-position web guide
502 moveable-position web guide
503 moveable-position web guide
504 fixed-position web guide
505 moveable portion
506 motion direction
510 fixed portion
515 carriage
516 mounting feature
517 sub-frame
518 sub-frame
540 web transport path
545 web transport system

The invention claimed is:

1. A modular thin film deposition system, comprising:
a machine base;
a deposition head rigidly positioned relative to the machine base for depositing a thin film of material onto a process surface of a substrate, the deposition head having an output face that faces the process surface of the substrate;
a motion actuator including a fixed portion rigidly attached to the machine base, and a moveable portion including kinematic mounting features; and
one or more interchangeable substrate positioner modules adapted to mount on the moveable portion of the motion actuator, wherein the one or more interchangeable substrate positioner modules include mating kinematic mounting features that engage with the kinematic mounting features of the moveable portion of the motion actuator, each interchangeable substrate positioner module adapted to position the substrate in proximity to the output face of the deposition head such that the process surface of the substrate is parallel to the output face of the deposition head and the substrate is free to move in a direction normal to the output face of the deposition head;
wherein the motion actuator moves the one or more interchangeable substrate positioner modules in a motion direction, thereby moving the substrate in an in-track direction in a plane parallel to the output face of the deposition head during deposition of the thin film of material onto the process surface of the substrate;
the modular thin film deposition system further including:
a gas-bearing backer having an output face for applying a non-contact force onto a back surface of the substrate opposite to the process surface of the substrate; and
a backer positioning device rigidly attached to the machine base, wherein the backer positioning device positions the gas-bearing backer in alignment with the deposition head and constrains a lateral motion of the gas-bearing backer while enabling the gas-bearing backer to freely move in the direction normal to the output face of the deposition head;
wherein the gas-bearing backer is moveable in a direction normal to the back surface of the substrate; and
wherein the backer positioning device includes a frame having an aperture that a perimeter of the gas-bearing backer fits within.

2. The modular thin film deposition system of claim 1, wherein two or more different interchangeable substrate positioner modules are used to configure the modular thin film deposition system to deposit the thin film material on a plurality of different substrate types.

3. The modular thin film deposition system of claim 2, wherein the plurality of different substrate types include two or more substrate types selected from the group consisting of a low-aspect-ratio rigid substrate having an aspect ratio of between 1:1 and 2:1, a low-aspect-ratio flexible substrate having an aspect ratio of between 1:1 and 2:1, a high-aspect-ratio rigid substrate having an aspect ratio greater than 2:1, a high-aspect-ratio flexible substrate having an aspect ratio greater than 2:1, and a continuous web of flexible substrate.

4. The modular thin film deposition system of claim 1, wherein the one or more interchangeable substrate positioner modules includes a substrate positioning frame, wherein features of the substrate engage with corresponding alignment features of the substrate positioning frame to constrain a lateral motion of the substrate while enabling the substrate to freely move in a direction normal to the output face of the deposition head.

5. The modular thin film deposition system of claim 4, wherein the alignment features of the substrate positioning frame include an aperture that a perimeter of the substrate fits within.

6. The modular thin film deposition system of claim 1, wherein substrate is a flexible substrate, and wherein the one or more interchangeable substrate positioner modules includes a substrate positioning frame having clamping mechanisms that clamp the flexible substrate to the substrate positioning frame.

7. The modular thin film deposition system of claim 6, wherein the substrate positioning frame imparts a tension to the flexible substrate.

8. The modular thin film deposition system of claim 6, wherein the substrate positioning frame includes a reference surface, and wherein a side of the flexible substrate that contacts the reference surface of the substrate positioning frame is the same side that includes the process surface of the substrate.

9. The modular thin film deposition system of claim 1, wherein the substrate is a web of substrate which is transported along a web transport path, the modular thin film deposition system further including first and second fixed-position web guides rigidly mounted with respect to the machine base;
    wherein the one or more interchangeable substrate positioner modules is a roll-to-roll substrate positioner module that includes first and second moveable-position web guides which are located in a fixed position relative to each other;
    wherein the web transport path directs the web of substrate around the first fixed-position web guide, then around the first moveable-position web guide, then around the second moveable-position web guide, and then around the second fixed-position web guide;
    wherein the deposition head is located along the web transport path between the first and second moveable position web guides; and
    wherein the web of substrate enters and exits the first and second moveable-position web guides in directions that are substantially parallel to the motion direction.

10. The modular thin film deposition system of claim 9, wherein at least one of the first fixed-position web guide, the first moveable-position web guide, the second moveable-position web guide, and the second fixed-position web guide is a gas turn bar or a roller.

11. The modular thin film deposition system of claim 9, wherein the first and second moveable-position web guides are portions of a monolithic moveable structure.

12. The modular thin film deposition system of claim 1, wherein the gas-bearing backer includes a heater that transfers heat to the substrate.

13. The modular thin film deposition system of claim 1, wherein the backer positioning device includes:
    an attachment mechanism rigidly attached to the machine base; and
    a flexure connected to the gas-bearing backer and the attachment mechanism;
    wherein the flexure flexes to enable the gas-bearing backer to freely move in a direction normal to the output face of the deposition head while constraining the lateral motion of the gas-bearing backer.

14. The modular thin film deposition system of claim 1, wherein the gas-bearing backer includes a heater that transfers heat to the substrate.

15. The modular thin film deposition system of claim 1, further including a mounting pedestal rigidly attached to the machine base, wherein the backer positioning device is mounted to the mounting pedestal, the mounting pedestal having kinematic mounting features that are compatible with kinematic mounting features on the backer positioning device.

16. The modular thin film deposition system of claim 15, wherein the kinematic mounting features on the mounting pedestal are compatible with the kinematic mounting features of the moveable portion of the motion actuator.

17. The modular thin film deposition system of claim 1, wherein the deposition head supplies a plurality of gaseous materials through output openings on the output face thereby exposing the process surface of the substrate to the plurality of gaseous materials.

18. The modular thin film deposition system of claim 17, wherein the plurality of gaseous materials includes at least two reactive gaseous materials that react to deposit a layer of solid material on the process surface of the substrate by an atomic layer deposition process.

19. The modular thin film deposition system of claim 17, wherein the deposition head is a vacuum-preloaded gas bearing deposition head, and wherein a gap between the output face of the deposition head and the process surface of the substrate is controlled by gas flows through the output face of the deposition head.

20. The modular thin film deposition system of claim 1, further including a motion control system that controls the moveable portion of the motion actuator to move the substrate in accordance with a defined motion pattern.

21. The modular thin film deposition system of claim 1, further including a gas manifold rigidly attached to the machine base, the gas manifold having an attachment face including a plurality of manifold gas ports;
    wherein the deposition head includes a mounting face opposite to the output face, the mounting face including a plurality of deposition head gas ports corresponding to the manifold gas ports, wherein gas passages connect the delivery head gas ports to openings on the output face;
    wherein the deposition head is rigidly fastened to the gas manifold with sealing elements positioned between the manifold gas ports and the deposition head gas ports; and
    wherein the mounting face of the deposition head and the attachment face of the gas manifold include alignment features for aligning the deposition head with the gas manifold.

* * * * *